(12) United States Patent
Nishiwaki

(10) Patent No.: US 8,993,871 B2
(45) Date of Patent: Mar. 31, 2015

(54) CONDENSING LENS ARRAY, AND SOLAR CELL PROVIDED WITH SAME

(75) Inventor: Seiji Nishiwaki, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/131,745

(22) PCT Filed: May 22, 2012

(86) PCT No.: PCT/JP2012/003339
§ 371 (c)(1),
(2), (4) Date: Jan. 9, 2014

(87) PCT Pub. No.: WO2013/011613
PCT Pub. Date: Jan. 24, 2013

(65) Prior Publication Data
US 2014/0158183 A1    Jun. 12, 2014

(30) Foreign Application Priority Data

Jul. 15, 2011   (JP) .................................. 2011-157194
Jan. 25, 2012   (JP) .................................. 2012-012606

(51) Int. Cl.
*H01L 31/052*   (2014.01)
*F24J 2/06*     (2006.01)
(Continued)

(52) U.S. Cl.
CPC ................. *G02B 3/0037* (2013.01); *F24J 2/06* (2013.01); *F24J 2/08* (2013.01); *G02B 3/005* (2013.01);
(Continued)

(58) Field of Classification Search
CPC .................................................. H01L 31/0524
USPC .................................................. 136/244, 259
See application file for complete search history.

(56) References Cited

U.S. PATENT DOCUMENTS 3,923,381 A * 12/1975 Winston .................... 359/852
4,003,638 A *  1/1977 Winston .................... 359/852
(Continued)

FOREIGN PATENT DOCUMENTS

JP    04-085515 A    3/1992
JP    07-098402 A    4/1995
(Continued)

OTHER PUBLICATIONS

International Search Report for corresponding International Application No. PCT/JP2012/003339 mailed Aug. 28, 2012.
(Continued)

*Primary Examiner* — Golam Mowla
(74) *Attorney, Agent, or Firm* — Renner, Otto, Boisselle & Sklar, LLP

(57) ABSTRACT

A concentrating lens array according to the present disclosure includes a plurality of unit structures arranged at least one-dimensionally. Each unit structure includes: a first surface through which light enters inside of the structure; a second surface which reflects the light that has entered the structure through the first surface; a third surface which reflects the light that has been reflected from the second surface; and a fourth surface which lets the light that has been reflected from the third surface go out of the structure. In each unit structure, the second and third surfaces are located between an incident plane including the first surface and an emitting plane including the fourth surface. At least one of the second and third surfaces reflects the light after having converged the incoming light. When viewed from over the incident plane, the second surface of each unit structure is laid upon the third surface of an adjacent unit structure, and is located closer to the incident plane than the third surface of the adjacent unit structure is.

17 Claims, 12 Drawing Sheets

(51) Int. Cl.
  *F24J 2/08* (2006.01)
  *G02B 3/00* (2006.01)
  *G02B 5/04* (2006.01)
  *G02B 19/00* (2006.01)
  *H01L 31/054* (2014.01)

(52) U.S. Cl.
  CPC ............ *G02B 3/0056* (2013.01); *G02B 5/045* (2013.01); *G02B 19/0028* (2013.01); *G02B 19/0042* (2013.01); *H01L 31/0543* (2013.01); *H01L 31/0547* (2013.01); *H02S 20/32* (2013.01); *Y02E 10/44* (2013.01); *Y02E 10/52* (2013.01)
  USPC .......................................... 136/246; 136/259

(56) References Cited

U.S. PATENT DOCUMENTS

| | | | | |
|---|---|---|---|---|
| 4,151,005 A | * | 4/1979 | Strebkov et al. | 136/256 |
| 4,158,356 A | * | 6/1979 | Wininger | 126/579 |
| 4,166,917 A | * | 9/1979 | Dorfeld et al. | 136/259 |
| 4,834,805 A | * | 5/1989 | Erbert | 136/246 |
| 5,150,259 A | | 9/1992 | Oishi | |
| 5,369,661 A | * | 11/1994 | Yamaguchi et al. | 372/69 |
| 5,513,201 A | | 4/1996 | Yamaguchi et al. | |
| 6,151,168 A | * | 11/2000 | Goering et al. | 359/623 |
| 6,181,473 B1 | | 1/2001 | Fujita et al. | |
| 6,481,859 B1 | | 11/2002 | Moseshvili | |
| 2008/0271776 A1 | | 11/2008 | Morgan | |
| 2009/0255568 A1 | | 10/2009 | Morgan | |
| 2010/0202142 A1 | | 8/2010 | Morgan | |
| 2010/0212717 A1 | * | 8/2010 | Whitlock et al. | 136/246 |
| 2011/0011449 A1 | | 1/2011 | Morgan et al. | |

FOREIGN PATENT DOCUMENTS

| | | |
|---|---|---|
| JP | 11-183840 A | 7/1999 |
| JP | 11-237553 A | 8/1999 |
| JP | 2000-243983 A | 9/2000 |
| JP | 2008-124381 A | 5/2008 |
| JP | 2010-525582 T | 7/2010 |
| JP | 2010-169981 A | 8/2010 |
| JP | 2010-230933 A | 10/2010 |

OTHER PUBLICATIONS

Form PCT/IPEA/409 for corresponding International Application No. PCT/JP2012/003339 dated Nov. 12, 2013.

* cited by examiner

CONDENSING LENS ARRAY, AND SOLAR CELL PROVIDED WITH SAME

TECHNICAL FIELD

The present application relates to a concentrating lens array for use in a sun-tracking concentrating solar cell and also relates to a solar cell using such an array.

BACKGROUND ART

A solar cell which converts photoelectrically solar energy into electrical energy is a promising power generator. Currently, however, the costs of semiconductor materials to make a solar cell and the costs of making a solar cell are so high that the unit cost (i.e., unit energy cost) to generate 1 kW of electric power using a solar cell is approximately several times as high as when electric power is generated using a thermal power system.

Also, the sun moves from the east to the west. That is why if the photosensitive plane of a solar cell is fixed, the angle of incidence of sunlight onto the solar cell changes as the sun moves. And as the angle of incidence changes, not only the effective light receiving area (which is proportional to $\cos\theta$ if the angle formed between a normal to the photosensitive plane of a solar cell and the incoming light ray is $\theta$) but also the reflectance from the photosensitive plane of the solar cell that would cause Fresnel reflection change as well. In general, at around noon, the absolute value of $\theta$ becomes the smallest, the effective light receiving area becomes the maximum, the surface reflection loss becomes the minimum, and the quantity of light received becomes the maximum.

For these reasons, some people have proposed a system for making a solar cell track the sun so that the incoming solar ray is always incident perpendicularly onto the photosensitive plane of the solar cell by shifting the entire solar cell according to the azimuth of the sun while concentrating the incoming solar ray with a large cross-sectional area onto the solar cell with a small area through a lens. Such a system is called a "sun-tracking concentrating solar cell". To track the sun, however, an apparatus for detecting the azimuth of the sun, a driver for rotating the solar cell in its entirety, and other devices are needed, thus raising the unit energy cost of such a sun-tracking concentrating solar cell. That is why the overall unit energy cost should be decreased either by running a huge number of solar cells using a single detector or driver with a lot of lens-solar cell combinations arranged as an array or by adopting an optical system that would achieve high light concentration efficiency (i.e., the ratio of the area of a lens to the area of a solar cell).

The structure of a conventional concentrating lens array for use in a sun-tracking concentrating solar cell will be described with reference to FIG. 14, which schematically illustrates a cross-sectional structure of a solar cell and a concentrating lens array arranged on the cell. As shown in FIG. 14, a plurality of photosensitive sections 3 are arranged as an array on a solar cell substrate 100, which includes a cooling mechanism (not shown) 10 prevent the incoming sunlight being concentrated onto the photosensitive sections 3 from overheating the solar cell substrate 100 to more than a predetermined temperature.

A concentrating lens array 5 is arranged over the solar cell substrate 100. The concentrating lens array 5 includes a plurality of micro lenses 5a which are arranged as an array in order to concentrate the incoming sun light onto the respective photosensitive sections 3. The surface 5s of each of those micro lenses 5a has an approximately spherical shape. An incoming solar ray 4 which is incident on a micro lens 5a along its center axis L gets refracted at its surface 5s to turn into a light ray 4a that converges toward a point F on its associated photosensitive section 3. This light ray 4a is received at the photosensitive section 3 and converted photoelectrically. In this structure, the lens array forms an integral part of the photosensitive sections of this solar cell, and an inexpensive solar cell with high light concentration efficiency would be provided by having this solar cell face the sunlight radiating direction.

CITATION LIST

Patent Literature

Patent Document No. 1: Japanese Laid-Open Patent Publication No. 2008-124381

SUMMARY OF INVENTION

Technical Problem

A solar cell with such a conventional concentrating lens array, however, concentrates the incoming sunlight through refraction of the light, and therefore, could produce chromatic aberration while concentrating the light.

A non-limiting exemplary embodiment of the present application provides a concentrating lens array which can concentrate incoming light with the chromatic aberration reduced and also provides a solar cell including such an array.

Solution to Problem

A concentrating lens array according to an aspect of the present invention includes a plurality of unit structures that are arranged at least one-dimensionally. Each unit structure includes: a first surface through which light enters inside of the unit structure; a second surface which reflects, back to the inside, the light that has entered the structure through the first surface and that has been transmitted through the inside; a third surface which reflects, back to the inside, the light that has been reflected from the second surface; and a fourth surface which lets the light that has been reflected from the third surface go out of the structure. In each unit structure, the second and third surfaces are located between an incident plane including the first surface and an emitting plane including the fourth surface. At least one of the second and third surfaces reflects the light after having converged the incoming light. When viewed perpendicularly to, and from over, the incident plane, the second surface of each unit structure is laid upon the third surface of an adjacent unit structure, and is located closer to the incident plane than the third surface of the adjacent unit structure is.

Advantageous Effects of Invention

By adopting a concentrating lens array according to an aspect of the present invention and a solar cell including such an array, incoming sunlight is concentrated by total reflection, and therefore, the chromatic aberration can be reduced significantly and high light concentration efficiency can be achieved.

DESCRIPTION OF EMBODIMENTS

The present inventor looked thoroughly into the problems with the conventional concentrating lens array for use in a solar cell.

First of all, the transparent medium such as resin or glass that forms the concentrating lens array will cause dispersion and its refractive index depends on the wavelength of the light transmitted through it. A solar cell needs to convert photoelectrically light falling within a broad wavelength range of 0.4 μm to 1.6 μm. Therefore, in a solar cell, the bigger the difference in wavelength, the bigger the difference in refractive index will be. And such a big difference in refractive index will cause a significant chromatic aberration in the light that has been concentrated through refraction, and the position of the point of condensation will vary significantly according to the wavelength. That is why not every light ray included in the sunlight can be converged toward the point F shown in FIG. 14 irrespective of its wavelength, but the light concentrated by a micro lens comes to have an increased spot size. To receive as much concentrated light as possible, the photosensitive section 3 needs to have an increased area. This means that the light concentration efficiency (which is represented by the ratio of the area of the lens to that of the photosensitive section) cannot be increased sufficiently.

Figure 14:
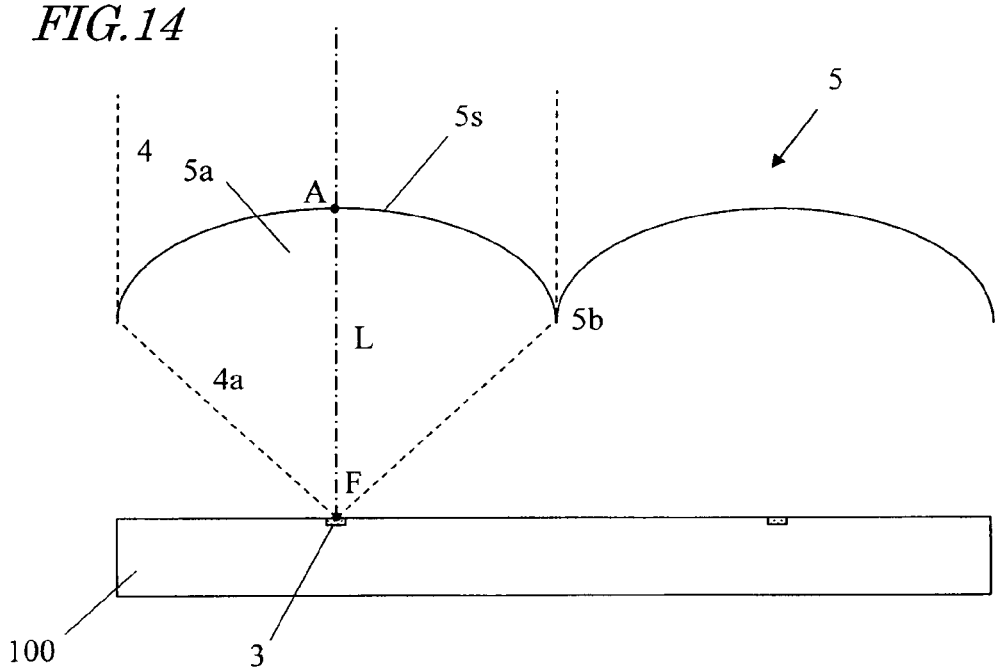
FIG. 14 A cross-sectional view illustrating the structure of a conventional concentrating solar cell.

Also, if the concentrating lens array is made of a resin material, its transmittance will decrease due to exposure to an ultraviolet ray as the lens is used for a longer and longer time. For that reason, the optical path lens AF inside the resin is suitably as short as possible as shown in FIG. 14. Also, to reduce the size of an image of the sun produced on the photosensitive plane by the lens, the optical path length AF is suitably as short as possible, too. And to shorten the optical path length AF, greater refracting force may be obtained by decreasing the radius of curvature of the surface 5s. In that case, however, a narrow and deep depression 5b will be formed between the respective surfaces 5s of adjacent micro lenses 5a. Since a normal to the surface forms a large angle with respect to the incoming light ray 4 in the vicinity of that depression, the reflection loss increases and the efficiency of incidence of the incoming light onto the photosensitive section 3 decreases.

Furthermore, since the micro lenses 5a are arranged two-dimensionally in the concentrating lens array 5, each depression 5b is interposed between two micro lenses 5a. That is why the smaller the radius of curvature of the surface 5s of each micro lens 5a, the deeper the depression 5b and the more easily dirt or dust will be deposited there. Also, once deposited, the dirt or dust cannot be removed easily. And such dirt or dust will also cause a decrease in the transmittance of the concentrating lens array.

On top of that, in the vicinity of the center axis L of the micro lens 5a, the sunlight is incident perpendicularly onto the surface 5s and the light reflected from the surface 5s also travels along the center axis L and the quantity of that reflected light is small. Off the center axis L, on the other hand, the sunlight is incident obliquely to the surface 5s, and the light reflected from the surface 5s forms a significant tilt angle with respect to the center axis L and the quantity of that reflected light increases. For that reason, if the radius of curvature of the surface 5s of the micro lens 5a is decreased, the quantity of reflected light to be scattered around increases, thus possibly producing light that would do damage on the surrounding environment.

Thus, to overcome these problems, the present inventor invented a novel concentrating lens array and a solar cell and sun-tracking solar cell system including such an array. An aspect of the present invention can be outlined as follows.

A concentrating lens array according to an aspect of the present invention includes a plurality of unit structures that are arranged at least one-dimensionally. Each unit structure includes: a first surface through which light enters inside of the unit structure; a second surface which reflects, back to the inside, the light that has entered the structure through the first surface and that has been transmitted through the inside; a third surface which reflects, back to the inside, the light that has been reflected from the second surface; and a fourth surface which lets the light that has been reflected from the third surface go out of the structure. In each unit structure, the second and third surfaces are located between an incident plane including the first surface and an emitting plane including the fourth surface. At least one of the second and third surfaces reflects the light after having converged the incoming light. When viewed perpendicularly to, and from over, the incident plane, the second surface of each unit structure is laid upon the third surface of an adjacent unit structure, and is located closer to the incident plane than the third surface of the adjacent unit structure is.

Each unit structure includes: a first concentrating member which has the first and second surfaces that are arranged perpendicularly to the incident plane and an emitting plane that lets the light that has been reflected from the second surface go out of the first concentrating member; and a second concentrating member which has the third and fourth surfaces that are arranged perpendicularly to the incident plane and an incident plane on which the light that has gone out of the first concentrating member through its emitting plane is incident. At least a part of the emitting plane of the first concentrating member and at least a part of the incident plane of the second concentrating member are in contact with each other.

Reflection from the second surface of the first concentrating member and reflection from the third surface of the second concentrating member include total reflection.

The first concentrating member of each unit structure is located on the second concentrating member of an adjacent unit structure.

At least one of the second and third surfaces forms part of a rotary surface.

The other of the second and third surfaces is a plane.

One of the second and third surfaces is a paraboloid and the other is a plane.

The second surface is a paraboloid and the third surface is a hyperboloid.

One of the first and fourth surfaces is a sphere, and one of the second and third surfaces is a hyperboloid and the other is a plane.

One of the first and fourth surfaces is a sphere and the second and third surfaces are hyperboloids.

The second surface has a curved shape which extends in a first direction, and the third surface has another curved shape which extends in a second direction that is not parallel to the first direction.

The first and second directions intersect with each other at right angles.

The first surface is a circular cylinder, of which the cylinder axis is parallel to the first direction, the second surface is a hyperbolic cylinder, of which the cylinder axis is parallel to the first direction, and the third surface is a parabolic cylinder, of which the cylinder axis is parallel to the second direction.

The first surface is a plane which is parallel to the first direction, the second surface is a parabolic cylinder, of which the cylinder axis is parallel to the first direction, and the third surface is a parabolic cylinder, of which the cylinder axis is parallel to the second direction.

The first surface is a sphere, the second surface is a hyperbolic cylinder, of which the cylinder axis is parallel to the first direction, and the third surface is a hyperbolic cylinder, of which the cylinder axis is parallel to the second direction.

A solar cell system according to another aspect of the present invention includes: the solar cell described above; a rotating mechanism section including a rotating motor to rotate the solar cell; a control section which generates a tracking error of the solar cell substrate with respect to the sun based on a signal supplied from the solar cell and which sends a rotation signal to the rotating mechanism section; and a power storing and transmitting section which either stores or transmits the electrical energy that has been generated by the solar cell substrate through conversion.

A solar cell according to still another aspect the present invention includes: a concentrating lens array according to any of the embodiments described above; and solar cell substrate which includes a plurality of photosensitive sections that are arranged at least one-dimensionally. Each unit structure of the concentrating lens array concentrates light onto associated ones of the photosensitive sections.

A concentrating optical system according to yet another aspect of the present invention includes: a first concentrating member which has a first surface through which light enters inside of the member, and a second surface which has a curved shape that extends in a first direction and which reflects the light that has entered the member through the first surface and that has been transmitted through the inside; and a second concentrating member which has a third surface that has another curved shape extending in a second direction that is not parallel to the first direction and that reflects, back to the inside, the light that has been reflected from the second surface of the first concentrating member and a fourth surface which lets the light that has been reflected from the third surface and transmitted through the inside go out of the member.

Hereinafter, embodiments of a concentrating lens array and a solar cell and sun-tracking solar cell system including such an array according to the present invention will be described with reference to the accompanying drawings.

Embodiment 1

Figure 1:
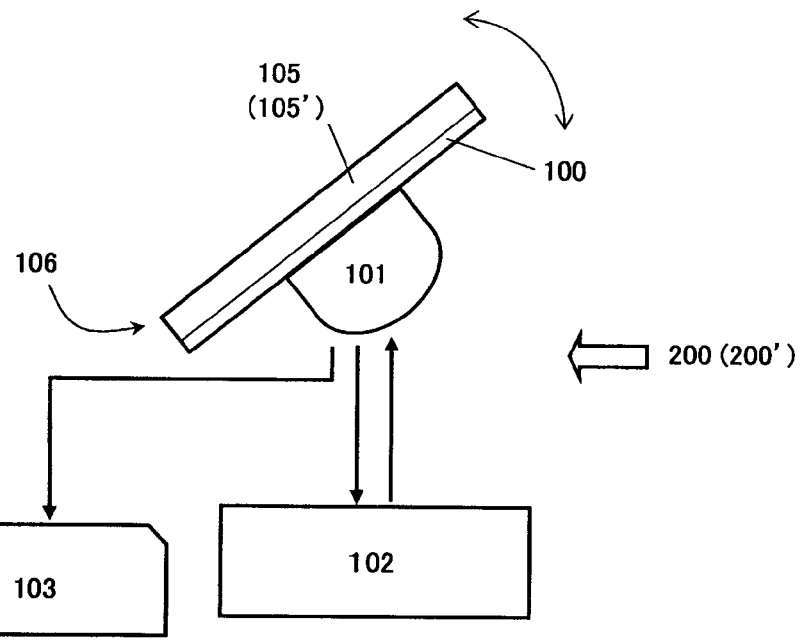
FIG. 1 Illustrates a general configuration for first and second embodiments of a sun-tracking solar cell system according to the present invention.

FIG. 1 illustrates a general configuration for a first embodiment of a sun-tracking solar cell system. The sun-tracking solar cell system 200 shown in FIG. 1 can be used effectively as a relatively large scale solar power generator. This sun-tracking solar cell system 200 includes a concentrating solar cell 106, a rotating mechanism section 101 including a rotating motor to rotate the concentrating solar cell 106, a control section 102 which generates a tracking error of a solar cell substrate 100 with respect to the sun based on a signal supplied from the concentrating solar cell 106 and which sends a rotation signal to the rotating mechanism section 101, and a power storing and transmitting section 103 which either stores or transmits the electrical energy that has been generated by the solar cell substrate 100 through conversion. The entire sun-tracking solar cell system 200 may be formed by known technologies except the concentrating solar cell 106, which includes a concentrating lens array 105 and the solar cell substrate 100. One of prime features of the present invention lies in the structure of the concentrating lens array 105, and therefore, the following description of the concentrating solar cell 106 will be focused on the structure of the concentrating lens array 105.

Figure 2:
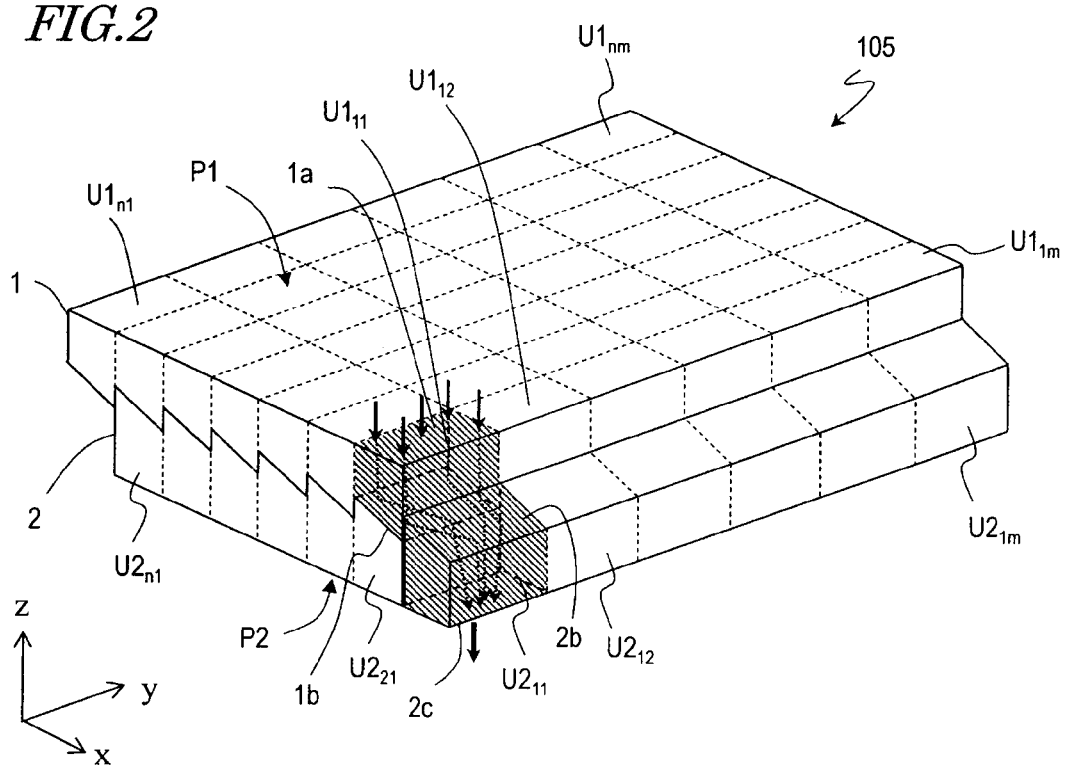
FIG. 2 A perspective view schematically illustrating the configuration of a concentrating lens array according to the first embodiment.

FIG. 2 is a perspective view schematically illustrating the configuration of the concentrating lens array 105. In FIG. 2, the concentrating lens array 105 has a structure in which a plurality of unit structures, each having the shadowed configuration, are arranged at least one-dimensionally. Even though the unit structures are supposed to be arranged two-dimensionally in FIG. 2 to form an n×m array in the x and y directions, the unit structures just need to be arranged at least one-dimensionally.

As shown in FIG. 2, each unit structure has first, second, third and fourth surfaces 1a, 1b, 2 and 2c. As indicated by the arrows in FIG. 2, the incoming sunlight that has entered the inside of the unit structure through the first surface 1a gets internally reflected a number of times from the second and third surfaces 1b and 2b to reach the fourth surface 2c, and eventually goes out of this structure through the fourth surface 2c. In the meantime, the sunlight reflected from at least one of the second and third surfaces 1b and 2b gets converged compared to the incoming sunlight. Since the angle of reflection does not depend on the wavelength of the reflected light, each unit structure can concentrate the sunlight with the chromatic aberration reduced.

In this embodiment, each unit structure includes first and second concentrating members 1 and 2. As shown in FIG. 2, the first and second concentrating members 1 and 2 of each unit structure are respectively connected to the first and second concentrating members 1 and 2 of an adjacent unit structure. In this description, the respective unit structure portions of the first concentrating members 1 are identified herein by $U1_{11}$, $U1_{12}$, ... $U1_{1m}$, ... $U1_{n1}$, ... and $U1_{nm}$, and the respective unit structure portions of the second concentrating members 2 are identified herein by $U2_{11}$, $U2_{12}$, ... $U2_{1m}$, ... $U2_{n1}$, ... and $U2_{nm}$. As will be described in detail later, the first concentrating member of each unit structure is not located on the second concentrating member of that unit structure but on the second concentrating member of another unit structure which is adjacent to the former unit structure in the x direction.

Since the respective unit structures are arranged two-dimensionally in the x and y directions, the first surfaces 1a of the respective unit structures are arranged on the same plane, which will be referred to herein as an "incident plane P1". Likewise, the fourth surfaces 2c of the respective unit structures are arranged on the same plane, which will be referred to herein as an "emitting plane P2". The first surfaces 1a of the respective unit structures are arranged on the incident plane P1 but do not have to form the same plane. In the same way, the fourth surfaces 2c of the respective unit structures do not have to form the same plane, either. The incident and emitting planes P1 and P2 are parallel to each other, and the emitting plane P2 is located on the opposite side of the concentrating lens array 105 from the incident plane P1. The second and third surfaces 1b and 2b are located between the incident and emitting planes P1 and P2.

Also, the first concentrating member of each unit structure is located on the second concentrating member of another unit structure that is adjacent to the former unit structure in the x direction. That is why when viewed perpendicularly to, and from over, the incident plane P1, the second surface 1b of each unit structure is laid on the third surface 2b of the adjacent unit structure and is located closer to the incident plane P1 than the third surface 2b of the adjacent unit structure is. In addition, when viewed perpendicularly to, and from over, the incident plane P1, the first and second surfaces 1a and 1b are laid one upon the other, so are the third and fourth surfaces 2b and 2c. That is why in each unit structure, the second and third surfaces 1b and 2b are not laid one upon the other when viewed perpendicularly to, and from over, the incident plane P1. However, if a number of unit structures are arranged at least in the x direction, the first surfaces 1a of the respective unit structures can be arranged on the incident plane P1 with no gap left between them. As a result, the sunlight that has been incident on the incident plane P1 can irradiate the solar cell substrate 100 non-wastefully. In addition, in each unit structure, the thickness of the concentrating lens array 105 (i.e., the thickness as measured in the z direction in FIG. 2) can be reduced with an optical path that is long enough to converge the sunlight internally secured. As a result, a lightweight concentrating lens array 105 is realized.

There are no unit structure portions of the second concentrating members 2 under the unit structure portions $U1_{n1}$, ... and $U1_{nm}$ of the first concentrating members 1. Likewise, there are no unit structure portions of the first concentrating members 1 over the unit structure portions $U2_{11}$, $U2_{12}$, ... and $U2_{1m}$ of the second concentrating members 2. Optionally, to close the gaps between those portions, unit structure portions of the first and second concentrating members 1 and 2 may be formed there. Also, even though each unit structure is supposed to be made up of first and second concentrating members in this embodiment, each unit structure may also be comprised of a single continuous structural member as well. In that case, the concentrating lens array 105 may be formed by making and arranging two-dimensionally a plurality of independent unit structures.

Figure 3:
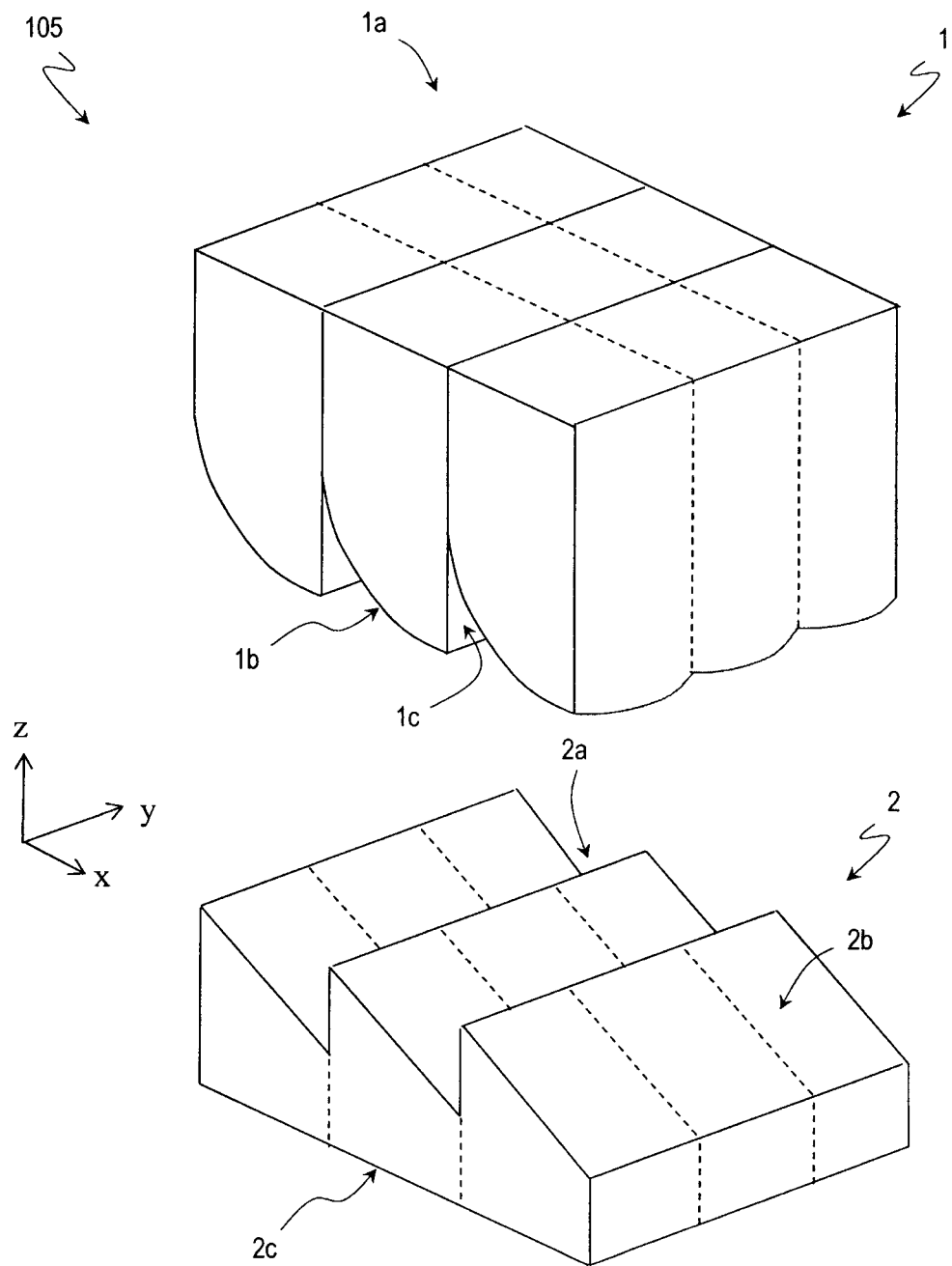
FIG. 3 An exploded perspective view illustrating 3×3 unit structures of a concentrating lens array according to the first embodiment.
Figure 4:
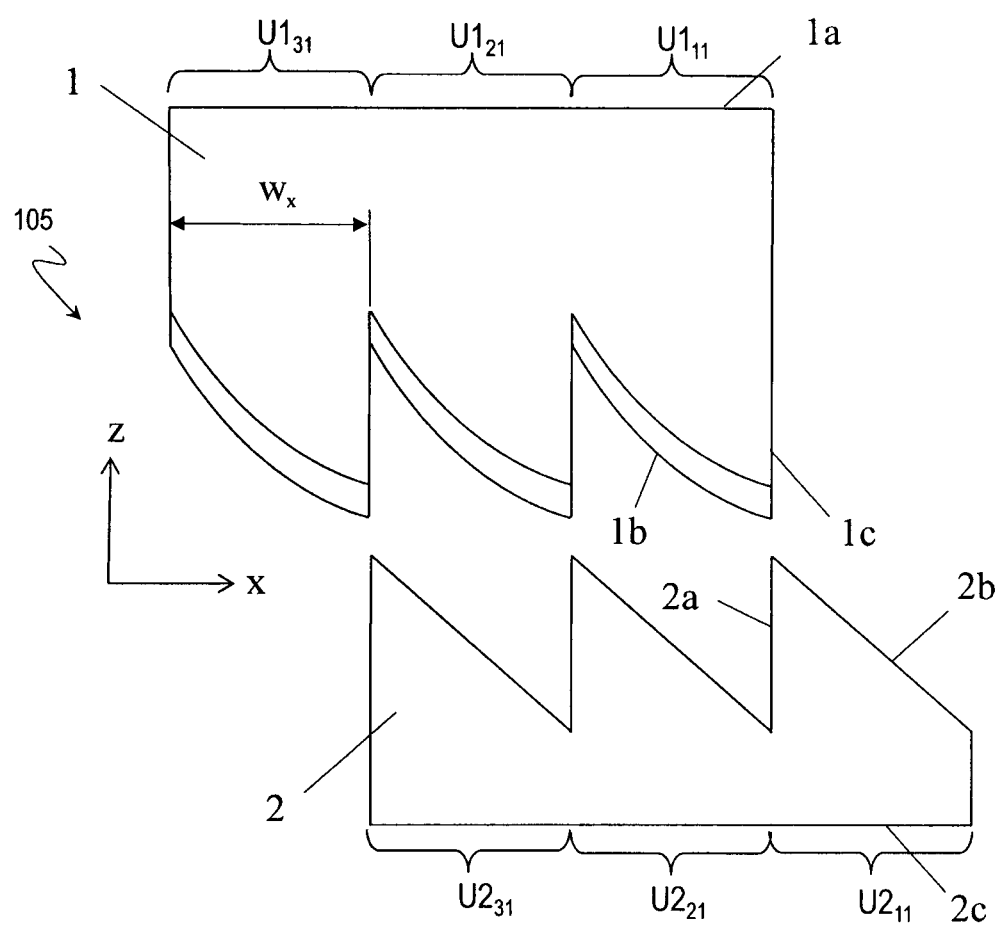
FIG. 4 An exploded side view illustrating how three unit structures which are arranged in the x direction in the concentrating lens array of the first embodiment look when viewed from the negative y-axis direction.
Figure 5:
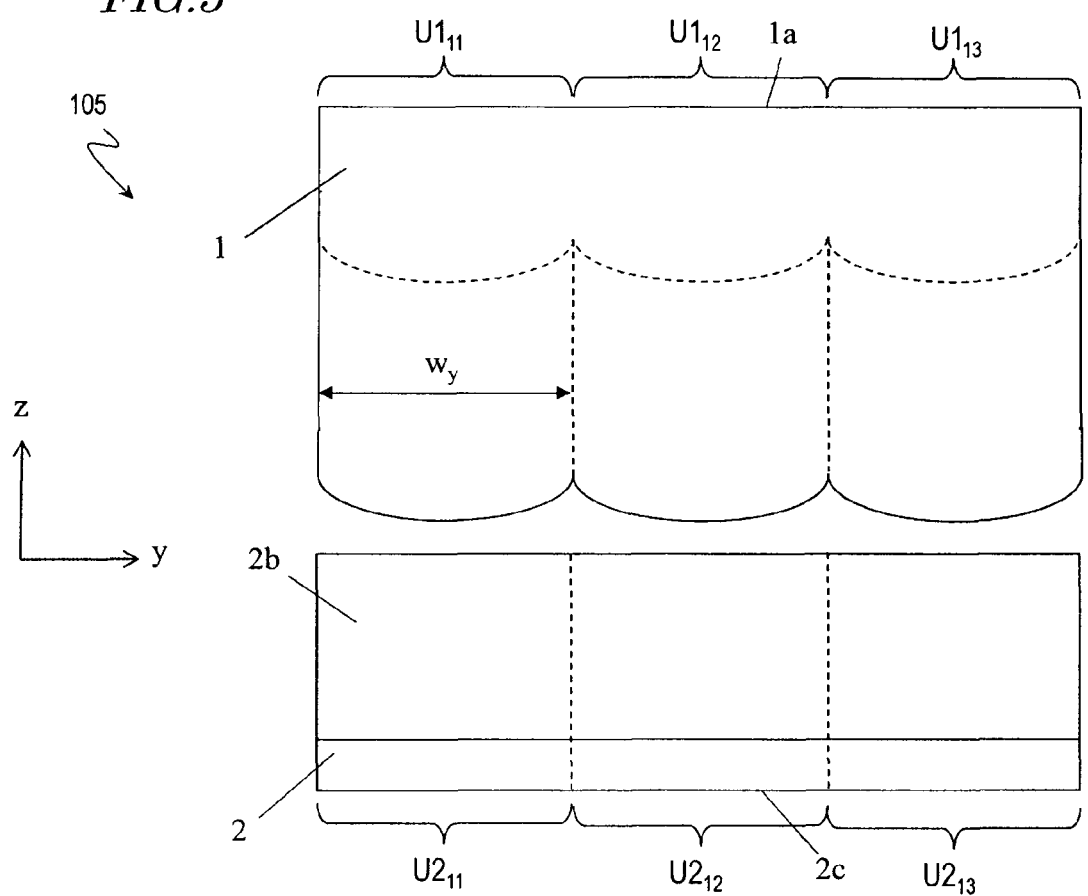
FIG. 5 An exploded side view illustrating how three unit structures which are arranged in the y direction in the concentrating lens array of the first embodiment look when viewed from the x-axis direction.
Figure 6:
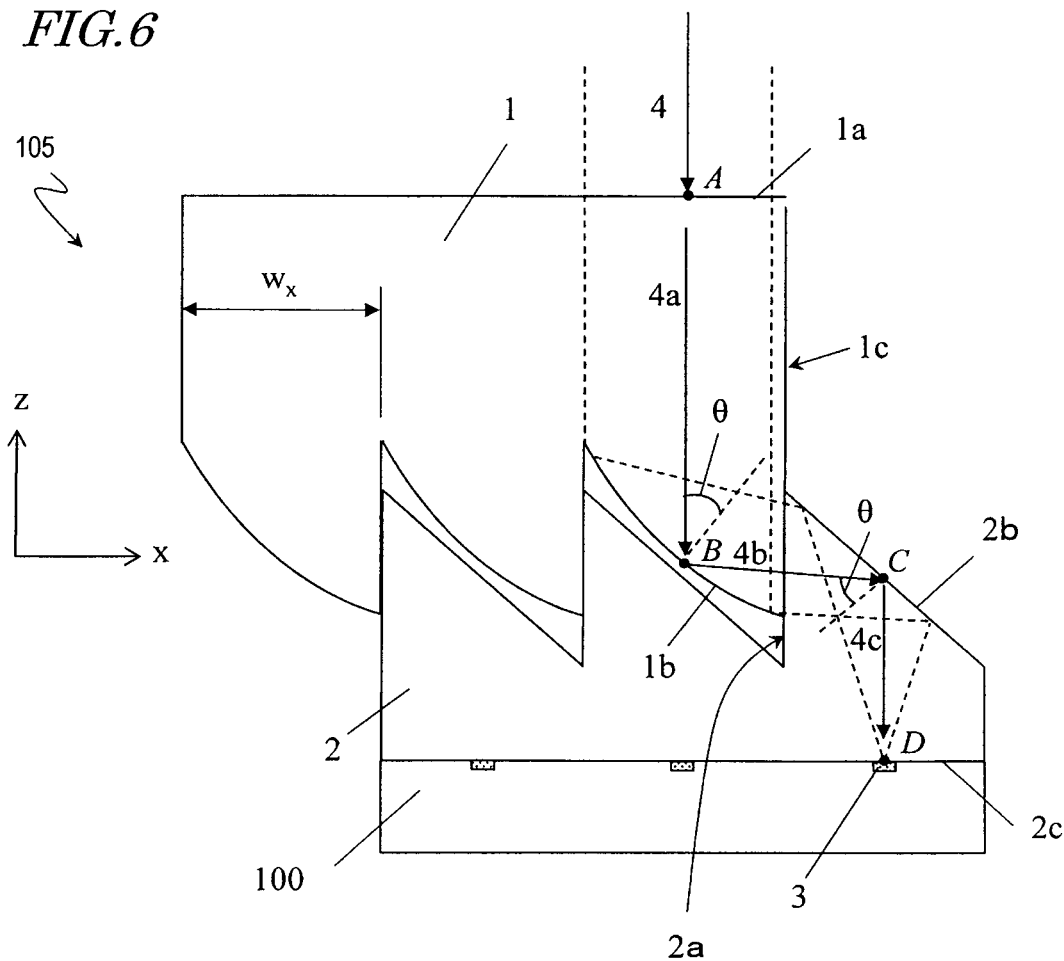
FIG. 6 A cross-sectional view illustrating how three unit structures which are arranged in the x direction in the concentrating solar cell of the first embodiment look when viewed from the negative y-axis direction.

FIG. 3 is an exploded perspective view illustrating 3×3 unit structures of a concentrating lens array according to the first embodiment. FIG. 4 is an exploded side view illustrating how three unit structures which are arranged in the x direction look when viewed from the negative y-axis direction. FIG. 5 is an exploded side view illustrating how three unit structures which are arranged in the y direction look when viewed from the x-axis direction. And FIG. 6 is a side view illustrating how three unit structures which are arranged in the x direction in the concentrating solar cell of this embodiment look when viewed from the negative y-axis direction. Hereinafter, the concentrating lens array and solar cell of this embodiment will be described further detail with reference to these drawings.

As described above, each unit structure of the concentrating lens array 105 includes first and second concentrating members 1 and 2, which are made of a material that has a high optical transmittance in the wavelength range of sunlight and that has light resistance. Specifically, the first and second concentrating members 1 and 2 may be made of various materials including glass and PMMA and other resins. However, glass is heavier than a resin. That is why if the first and second concentrating members 1 and 2 are made of glass, the weight of the concentrating lens array 105 increases. For that reason, to lighten the load on the rotating mechanism section 101, it is recommended that the first and second concentrating members 1 and 2 be made of a resin. In this case, the first and second concentrating members 1 and 2 may be made of the same material or mutually different materials. In this embodiment, the first and second concentrating members 1 and 2 are made of the same material.

As shown in FIGS. 3 and 4, the first concentrating member 1 has first and second surfaces 1a and 1b. The incoming sunlight is incident on the first surface 1a, travels through the inside of the first concentrating member 1, and then is reflected from the second surface 1b. In this embodiment, the second surface 1b may form part of a rotary surface or may be a free-form surface. In this description, the "rotary surface" refers herein to a surface to be defined by rotating a line or curve on a plane around another line on that plane. In particular, the second surface 1b may be a part of a rotary surface, and that part that forms the second surface 1b does not have to include the axis of rotation of the rotary surface. For example, the second surface 1b is suitably a paraboloid which is defined by rotating a parabola. That is to say, xz and yz cross sections of the second surface 1b are both parabolas. The reflection from the second surface 1b is Fresnel reflection (including total reflection) to be caused due to a difference in refractive index between the material of the first concentrating member 1 and the environmental medium (such as the air) that surrounds the first concentrating member 1. The first and second surfaces 1a and 1b face each other and the orthogonal projection of the second surface 1b onto the first surface 1a covers the first surface 1a almost entirely. The first concentrating member 1 further has an emitting surface 1c, through, which the sunlight that has been reflected from the second surface goes out of this member. The emitting surface 1c is located between the first and second surfaces 1a and 1b. The first surface 1a is suitably a plane. The first concentrating member 1 has a width Wx in the x direction and a width Wy in the y direction.

As shown in FIGS. 3, 4 and 5, the second concentrating member 2 has third and fourth surfaces 2b and 2c. The third surface 2b is a plane and reflects the sunlight that has been reflected from the second surface 1b of the first concentrating member 1 toward the inside of the second concentrating member 2. As in the first concentrating member 1, this reflection is also Fresnel reflection including total reflection. The fourth surface 2c lets the sunlight that has been transmitted through the inside of the second concentrating member 2 go out of the second member 2. The second concentrating member 2 further has an incident surface 2a on which the sunlight that has been reflected from the second surface 1b of the first concentrating member 1 is incident. The incident surface 2a is located between the third and fourth surfaces 2b and 2c.

As shown in FIG. 6, in the concentrating lens array 105, the first and second concentrating members 1 and 2 are arranged so that at least part of the emitting surface is of the first concentrating member 1 and at least part of the incident surface 2a of the second concentrating member 2 are in contact with each other. To transmit the sunlight efficiently through the junction between the emitting surface 1c of the first concentrating member 1 and the incident surface 2a of the second concentrating member 2, the emitting surface 1c and the incident surface 2a are suitably planes. However, if the first and second concentrating members 1 and 2 are made of the same material and have the same refractive index, the emitting surface 1c and the incident surface 2a may have any other shape as long as the emitting surface 1c and the incident surface 2a have corresponding shapes and can be closely bonded together with an adhesive with no gaps left between them. On the other hand, if the unit structure is implemented as a single continuous structural member, there is no emitting surface 1c or incident surface 2a. The fourth surface 2c may be a plane, a curved surface, a spherical surface or a cylindrical surface. Optionally, the photosensitive sections 3 and the fourth surface 2c may also be bonded together with an adhesive.

As described above, the first concentrating member of each unit structure is located on the second concentrating member 2 of another unit structure that is adjacent to the former unit structure in the x direction. A gap is suitably left between the second surface 1b of the first concentrating member 1 and the third surface 2b of the second concentrating member 2 of the unit structure that is located adjacent to, and right under, the second surface 1b. The reason is that if the second and third surfaces 1b and 2b were in contact with each other, the sunlight would be transmitted from the first concentrating member 1 into the second concentrating member 2 of the adjacent unit structure through the contacting portion of the second surface 1b. In this embodiment, however, the third surface 2b is a plane but the second surface 1b forms part of a rotary surface and has curved shapes in mutually different directions. That is why if the second and third surfaces 1b and 2b contact with each other, their contacting portion will be a point. For that reason, even if the second and third surfaces 1b and 2b contact with each other, almost no light will be transmitted from the first concentrating member 1 into the second concentrating member 2 of the adjacent unit structure, thus causing no serious problems.

In the concentrating lens array 105, the sunlight that has been incident on the first surface 1a of the first concentrating member 1 is reflected from the second surface 1b and then goes out of the first concentrating member 1 through the emitting surface 1c. Since the second surface 1b has a parabolic curved shape in this embodiment, the incident sunlight has a predetermined converged state on both of xz and yz cross sections. Next, the sunlight that has gone out of the first concentrating member 1 enters the second concentrating member 2 through the incident surface 2a, is reflected from the third surface 2b, and then goes out of the second concentrating member 2 through the fourth surface 2c. The sunlight that has gone out through the fourth surface 2c is condensed toward a point and can produce an image of the sun on the focal plane. As shown in FIG. 6, the solar cell substrate 100 including a plurality of photosensitive sections is bonded to the fourth surface 2c of the second concentrating member 2. The sunlight that has been concentrated as described above by the respective unit structures of the concentrating lens array 105 then irradiates the photosensitive sections 3 which are arranged to face the respective unit structures of the concentrating lens array 105. As a result, the sunlight can be collected with high light concentration efficiency and can be converted into electrical energy by the photosensitive sections 3 of the solar cell. The sunlight can be converged in this manner by Fresnel reflection including the total reflection from the second surface 1b of the first concentrating member 1 and the third surface 2b of the second concentrating member 2b. That is why the sunlight can be collected with chromatic aberration reduced without depending on the refractive index dispersion or wavelength of the material. That is to say, even if the wavelength changes, the spot of the sunlight that irradiates the photosensitive sections 3 does not change and can even have its size reduced. As a result, the light can be incident efficiently within the photosensitive sections 3.

Next, a structure that will concentrate the incoming light even more efficiently will be described with reference to FIGS. 3 through 6. In the concentrating lens array 105 shown in FIGS. 3 to 6, the first and second surfaces 1a and 1b of the first concentrating member 1 are a plane and a rotary surface (or free-form surface) such as a parabolic surface, respectively, and the third and fourth surfaces 2b and 2c of the second concentrating member 2 are planes.

Since the first surface 1a is a plane, the substantially parallel solar ray 4 is incident perpendicularly onto the first surface 1a to turn into a parallel light ray 4a. This light ray 4a is reflected from the second surface 1b to turn into a light ray 4b. Thereafter, the light ray 4b is further reflected from the third surface 2b to turn into a light ray 4c, which travels along the z axis and then goes out of the second concentrating member through the fourth surface 2c. The outgoing solar ray is then condensed onto a point D on a photosensitive section 3 of the solar cell substrate 100.

Suppose the intersections between the optical axis of the sunlight and the first, second and third surfaces 1a, 1b and 2b are indicated by A, B and C, respectively. Also, the refractive index of the material that makes the first and second concentrating members 1 and 2 is supposed to be n. If the tilt angle $\theta$ defined by the optical axis of the light ray 4a with respect to a surface normal to the point B on the second surface 1b (where AB=z axis) is sufficiently larger than arcsin (1/n), the sunlight will be totally reflected from the entire area of the second surface 1b. For example, if the first and second concentrating members 1 and 2 are made of PMMA, the critical angle $\theta c$ at and over which the total reflection is produced is approximately 42 degrees, because PMMA has a refractive index of approximately 1.5. For that reason, the tilt angle $\theta$ is at least equal to 45 degrees, and suitably equal to or greater than approximately 50 degrees.

If the tilt angle defined by the optical axis (BC) of the light ray 4b with respect to a surface normal to the point C on the third surface 2b is set to be equal to $\theta$, the light ray 4b will also be totally reflected from the third surface 2b. The optical axis of the reflected light ray 4c agrees with that of the light ray 4a and is parallel to the z axis. Also, in this case, the optical axis of the reflected light ray 4b, i.e., its propagation direction, forms an angle 2θ (which is equal to or greater than approximately 90 degrees) with respect to the optical axis of the light ray 4a. Thus, the light ray 4b propagates through the negative side of the z axis. Consequently, the point C is located on the negative side of the z axis with respect to the point B. The tangent drawn at the point B at which the second surface 1b intersects with the xz plane curve is parallel to a line on which the third surface 2b intersects with the xz plane. That is why if the point C is located on the negative side of the z axis with respect to the point B, the third surface 2b will be located on the negative side of the z axis with respect to the second surface 1b that is located adjacent to the third surface 2b in the x direction and right over the third surface 2b when compared to each other at the same position x. Also, although the second surface 1b projects in the negative z-axis direction on a yz cross section, the third surface 2b is a line including the point C on the yz plane. For that reason, if the point C is located on the negative side of the z axis with respect to the point B, the third surface 2b will be located on the negative side of the z axis with respect to the second surface 1b which is adjacent to the third surface 2b in the x direction and located right over the third surface 2b even when compared at the same position y.

As described above, in each unit structure, the first concentrating member 1 is not located over the second concentrating member 2 of its own, but is located over the second concentrating member 2 of another unit structure that is adjacent to the former unit structure in the x direction. That is why the foregoing statement of the relative positions of the second and third surfaces 1b and 2b in each unit structure also applies to the relative positions of the second surface 1b in each unit structure and the third surface 2b of the adjacent unit structure. That is to say, the second surface 1b of the first concentrating member 1 in each unit structure is located on the positive side of the z axis with respect to the third surface 2b of the second concentrating member 2 of the adjacent unit structure. And the first concentrating member 1 of each unit structure can be arranged over the second concentrating member 2 of the adjacent unit structure without causing interference between them. By arranging such unit structures repeatedly in the concentrating lens array 105, the textured structure defined by the respective second surfaces 1b of the first concentrating members 1 is engageable with the planar structure defined by the respective third surfaces 2b of the second concentrating members 2.

Next, respective curved shapes of the first, second and third surfaces 1a, 1b and 2b will be described. Generally speaking, a paraboloid has a single focal line F, and a parallel light ray traveling along the center axis is reflected from the paraboloid and concentrated to the focal line F with no aberrations. The sunlight on an xz plane is concentrated on an xz cross section of the second surface 1b. Supposing the focal line of a parabola on the xz cross section of the second surface 1b is $F_1$, the parabola can be determined so that the focal line $F_1$ passes through the point D. In the same way, supposing the focal line of a parabola on the yz cross section of the second surface 1b is $F_2$, the parabola can be determined so that the focal line $F_2$ passes through the point D. These focal lines $F_1$ and $F_2$ intersect with each other at right angles on the detecting plane.

It should be noted that the sunlight is not perfectly parallel light but its propagating direction will vary by approximately ±0.26 degrees. Also, a sun-tracking concentrating solar cell system will cause a sun-tracking control error of approximately ±0.2 degrees. That is why when light is incident obliquely, its point of convergence grows to a certain size but the spot size can still be an extremely small one because no chromatic aberrations will be produced. The area of each photosensitive section 3 can be adjusted according to the spot size of the sunlight incident on the photosensitive section 3. For example, if the spot of the sunlight incident on the photosensitive section 3 has a diameter of 5 mm or less, the photosensitive section 3 may have a size of approximately 5 mm each side. In that case, even if the focal lines $F_1$ and $F_2$ do not exactly satisfy the relation described above but if the sunlight can be converged to a light ray with a diameter of 5 mm or less at the photosensitive section 3, sufficiently high conversion efficiency can still be maintained.

As can be seen, by using this second surface 1b, the concentrating lens array 105 of this embodiment can concentrate the incoming light on an xz cross section and on a yz cross section at the same time. In addition, since each surface of the first and second concentrating members 1 and 2 is a combination of a plane and a rotary surface such as a paraboloid, such concentrating members can be made easily by machining. Also, even if the first and second concentrating members 1 and 2 are formed on a unit structure basis, the concentrating lens array 105 can also be obtained just by fitting those unit structures to each other and bonding their flat portions together with an adhesive. As a result, such an array of lenses can be formed very easily. On top of that, since the first surface 1a is a plane, deposition of dirt or dust on the depressions of the surface can be reduced significantly. Moreover, since the light is reflected from the first surface 1a substantially along the axis of incidence, the light is reflected too little to be scattered around and cause harmful effects on the surrounding environment.

Furthermore, the incoming light is concentrated by being reflected from the second and third surfaces 1b and 2b. Since the first surface 1a has almost no refracting power, the chromatic aberration involved with concentrating the light can be reduced to almost zero. That is why the size of the condensed spot can be reduced at the point of convergence, and the area of the photosensitive section 3 to capture the light can be reduced, too. Moreover, reflection from these surfaces is total reflection that involves no loss, and the light can be transmitted highly efficiently. For these reasons, a solar cell including an inexpensive and stabilized concentrating lens array with high light concentration efficiency (which is the ratio of the lens area to the overall photosensitive section area) can be provided.

The concentrating lens array and solar cell of the embodiment described above is just an example, and may be modified in various manners. For example, in the embodiment described above, reflection from the second and third surfaces 1b and 2b is supposed to be Fresnel reflection including total reflection. However, a metal film may be provided for at least one of the second and third surfaces 1b and 2b so that the sunlight is reflected partially by the metal film.

Also, even though the second and third surfaces 1b and 2b are supposed to be a rotary surface such as a paraboloid and a plane, respectively, in the embodiment described above, the second and third surfaces 1b and 2b may also be a plane and a rotary surface such as a paraboloid, respectively. In that case, the sunlight that has been incident on the first surface 1a is reflected from the second surface 1b while being parallel light, and incident on the third surface 2b. The third surface 2b is implemented as a paraboloid, of which the focus is located at the point D shown in FIG. 6, and the sunlight is reflected from the third surface 2b and converged onto the photosensitive section 3 where the point D is present.

Figure 7:
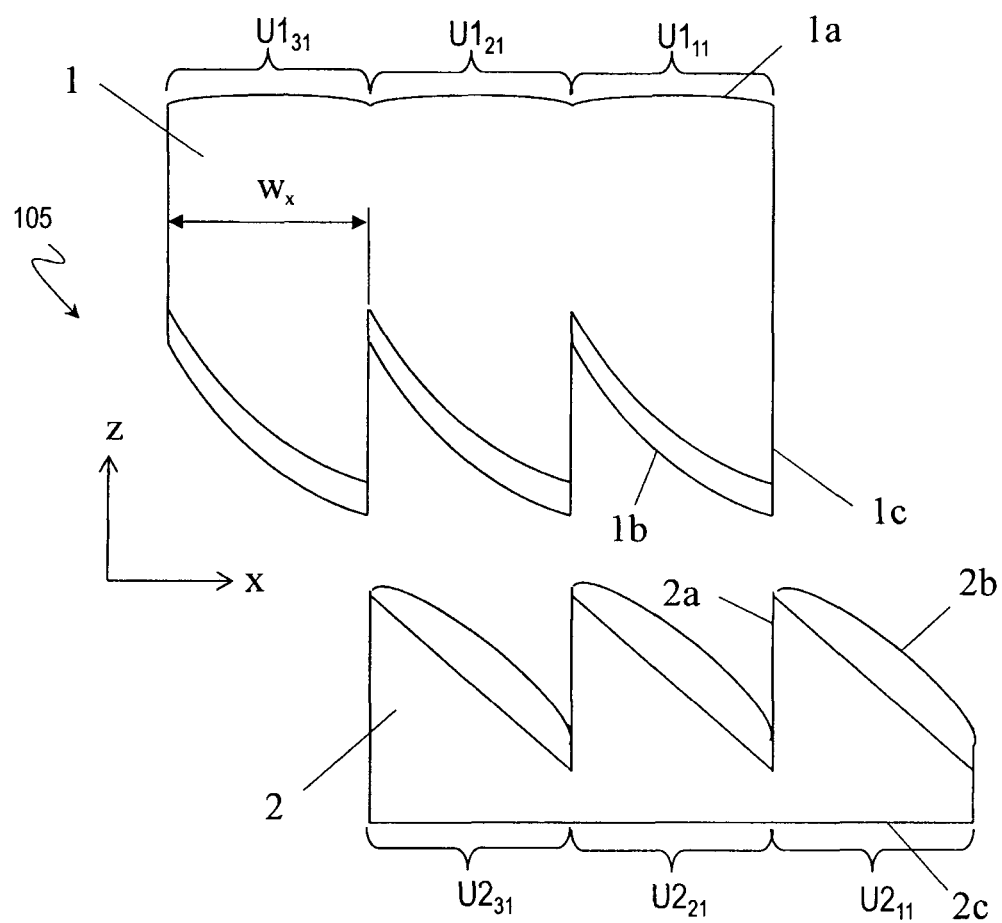
FIG. 7 An exploded side view illustrating how three unit structures which are arranged in the x direction in a concentrating solar cell according to another embodiment look when viewed from the negative y-axis direction.

Furthermore, in the concentrating lens array, the sunlight may also be concentrated on both of the second and third surfaces 1b and 2b. FIG. 7 is an exploded side view illustrating how three unit structures which are arranged in the x direction in such a concentrating lens array that concentrates the sunlight on both of the second and third surfaces 1b and 2b look when viewed from the negative y-axis direction. This concentrating lens array has the same configuration as the embodiment described above except the shapes of the second and third surfaces 1b and 2b. And their common features will not be described all over again to avoid redundancies. In the concentrating lens array shown in FIG. 7, the second surface 1b is a paraboloid and the third surface 2b is a hyperboloid. More specifically, the xz and yz cross sections of the second surface 1b are parabolas and the xz and yz cross sections of the third surface 2b are hyperbolas. Generally speaking, a hyperbola has two focuses $F_1$ and $F_2$. A light ray concentrated at the focus $F_2$ is reflected from the hyperbola and concentrated at the other focus $F_1$ with no aberrations. Supposing the focus of the parabola defining the second surface 1b is $F_3$, the focus $F_3$ suitably agrees with the focus $F_1$ of the third surface 2b. The incoming sunlight that has been incident on the first surface 1a of the first concentrating member 1 is reflected in a predetermined concentrated state from the second surface 1b and goes out of the first concentrating member 1 through the emitting surface 1c. The sunlight that has gone out of the first concentrating member 1 enters the second concentrating member 2 through the incident surface 2a, is reflected from the third surface 2b, is further concentrated and then goes out of the second concentrating member 2 through the fourth surface 2c. The sunlight that has gone out through the fourth surface 2c can be concentrated at a point and an image of the sun can be produced on the focal plane.

The concentrating lens array shown in FIG. 7 converges the sunlight at the second and third surfaces 1b and 2b, and therefore, can be designed so as to satisfy a sine condition. If the sine condition is satisfied, even light that has been incident obliquely can also have its aberration reduced. As described above, the sunlight has a variation in angle of view of approximately ±0.26 degrees and will cause a sun-tracking control error of approximately ±0.2 degrees. However, even if there is such an angular error, the aberration caused by the converged light can also be local minimum. Consequently, besides having no chromatic aberration, the spot size can be reduced, and the light concentration efficiency can be increased, even more significantly than in the embodiment described above.

In the embodiment described above, the first and fourth surfaces 1a and 2c are supposed to be planes. However, unless a significant error is caused, the first and fourth surfaces 1a and 2c may also be curved ones. In that case, the second and third surfaces 1b and 2b may be hyperboloids. Also, if either the first surface 1a or the fourth surface 2c has a circular cylindrical shape, the second and third surfaces 1b and 2b become hyperbolas on either an xz cross section or a yz cross section that is along the axis of the circular cylinder. The following Table 1 shows every possible combination of surfaces that the concentrating lens array of this embodiment can have:

TABLE 1

| First surface 1a | Second surface 1b | Third surface 2b | Fourth surface 2c |
|---|---|---|---|
| Plane | Paraboloid | Plane | Plane |
| Plane | Plane | Paraboloid | Plane |
| Plane | Paraboloid | Hyperboloid | Plane |
| Sphere (plane) | Hyperboloid | Hyperboloid | Plane (sphere) |
| Sphere (plane) | Hyperboloid | Plane | Plane (sphere) |
| Sphere (plane) | Plane | Hyperboloid | Plane (sphere) |

Embodiment 2

Hereinafter, a second embodiment of a concentrating lens array, solar cell including such an array, and sun-tracking solar cell system according to the present invention will be described with reference to the accompanying drawings.

As shown in FIG. 1, the solar cell system 200' of this embodiment has the same structure as the solar cell system 200 of the first embodiment except that the system 200' of this embodiment includes a concentrating lens array 105' having a different structure from the counterpart of the first embodiment. Specifically, in each unit structure of the concentrating lens array 105', the second and third surfaces 1b and 2b are cylindrical curved surfaces, which is a major difference from the first embodiment. Thus, the following description will be focused on the structure of the concentrating lens array 105'.

Figure 8:
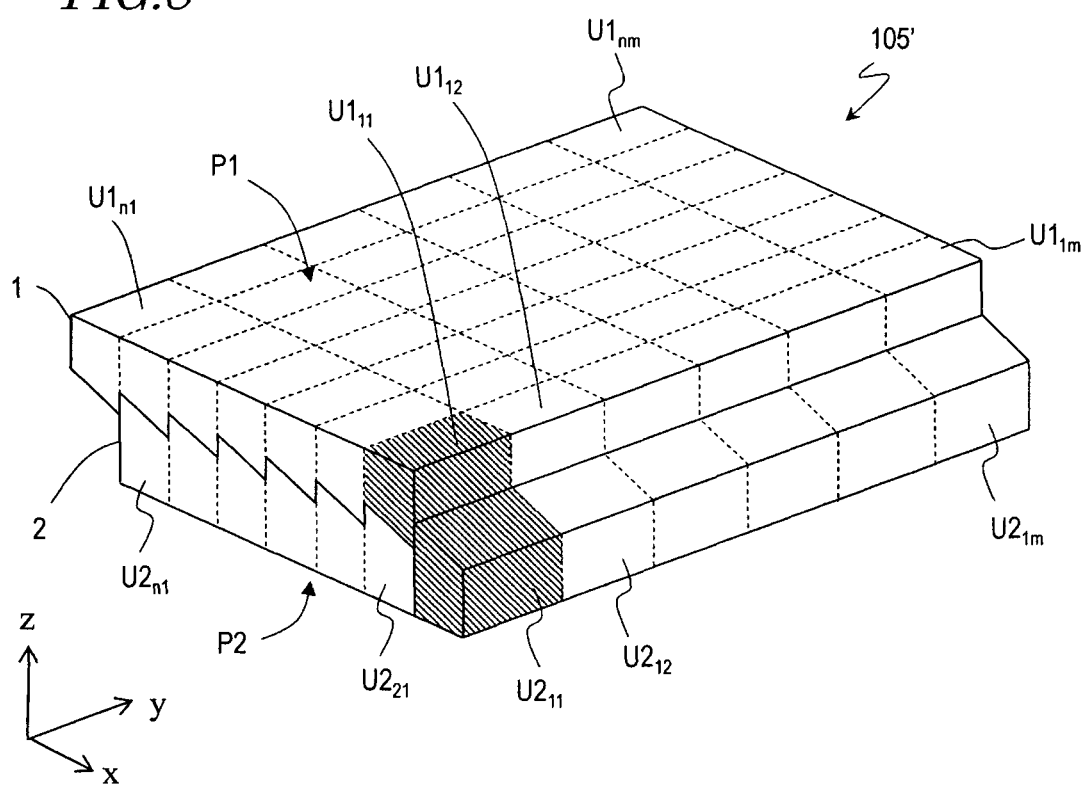
FIG. 8 A perspective view schematically illustrating the configuration of a concentrating lens array according to a second embodiment.

FIG. 8 is a perspective view schematically illustrating the configuration of the concentrating lens array 105'. In FIG. 8, the concentrating lens array 105' has a structure in which a plurality of unit structures, each having the shadowed configuration, are arranged at least one-dimensionally. Even though the unit structures are supposed to be arranged two-dimensionally in FIG. 8 to form an n×m array in the x and y directions, the unit structures just need to be arranged at least one-dimensionally.

As in the first embodiment, each unit structure also has first and second concentrating members 1 and 2. As shown in FIG. 8, the respective unit structures are also arranged as in the first embodiment. Optionally, each unit structure may also be comprised of a single continuous structural member as well.

Figure 9:
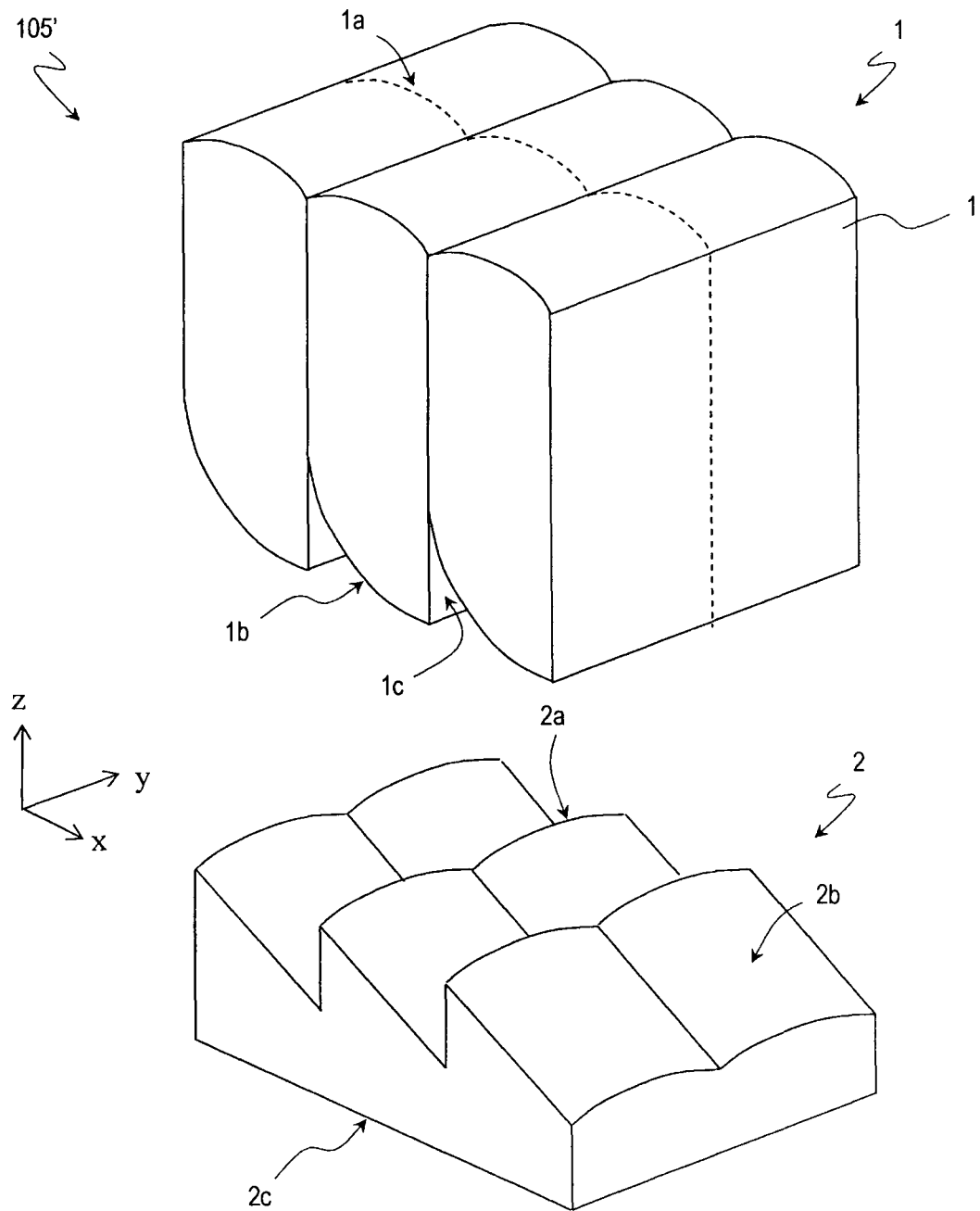
FIG. 9 An exploded perspective view illustrating 3×2 unit structures of a concentrating lens array according to the second embodiment.
Figure 10:
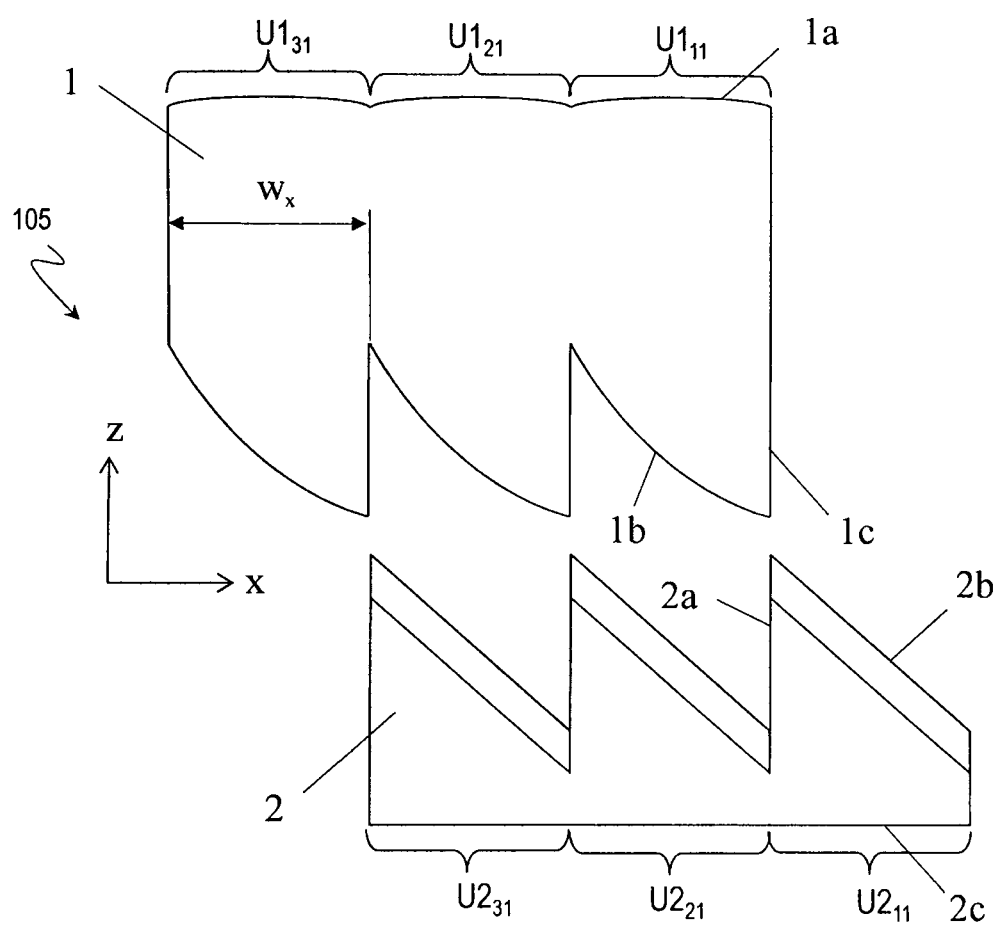
FIG. 10 An exploded side view illustrating how three unit structures which are arranged in the x direction in the concentrating lens array of the second embodiment look when viewed from the negative y-axis direction.
Figure 11:
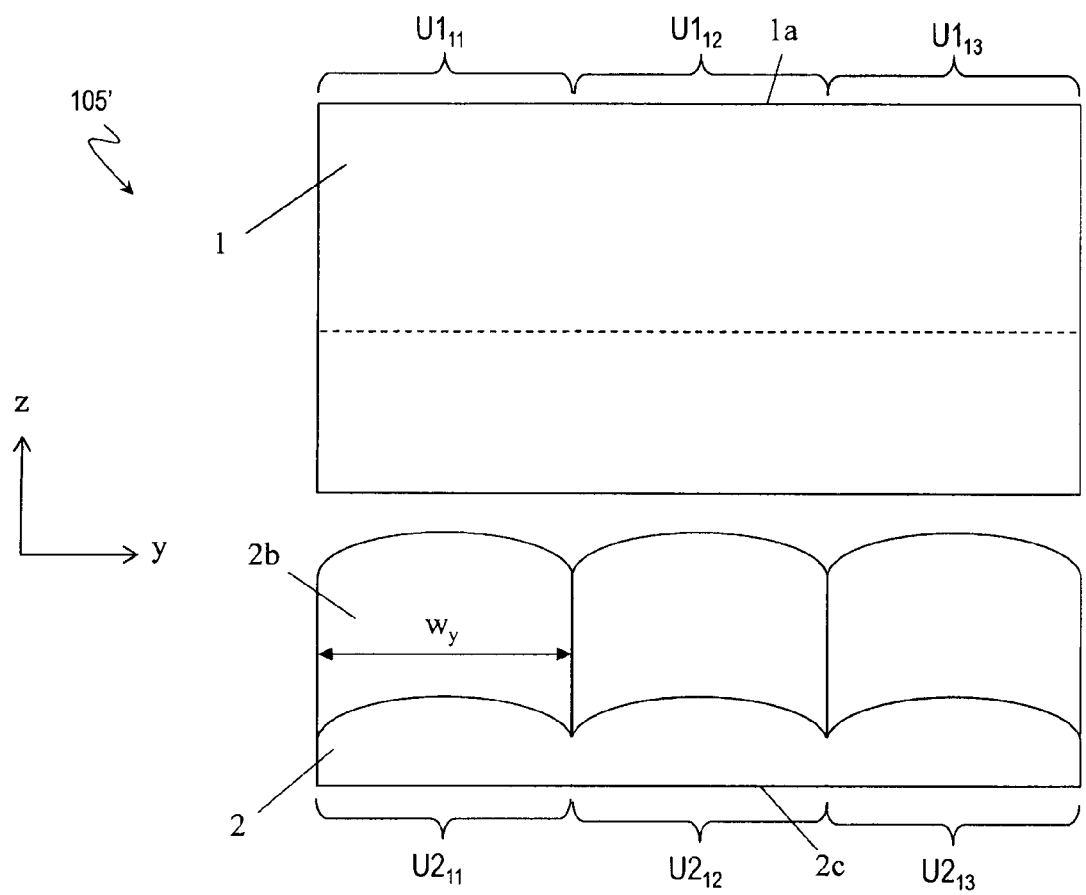
FIG. 11 An exploded side view illustrating how three unit structures which are arranged in the y direction in the concentrating lens array of the second embodiment look when viewed from the x-axis direction.
Figure 12:
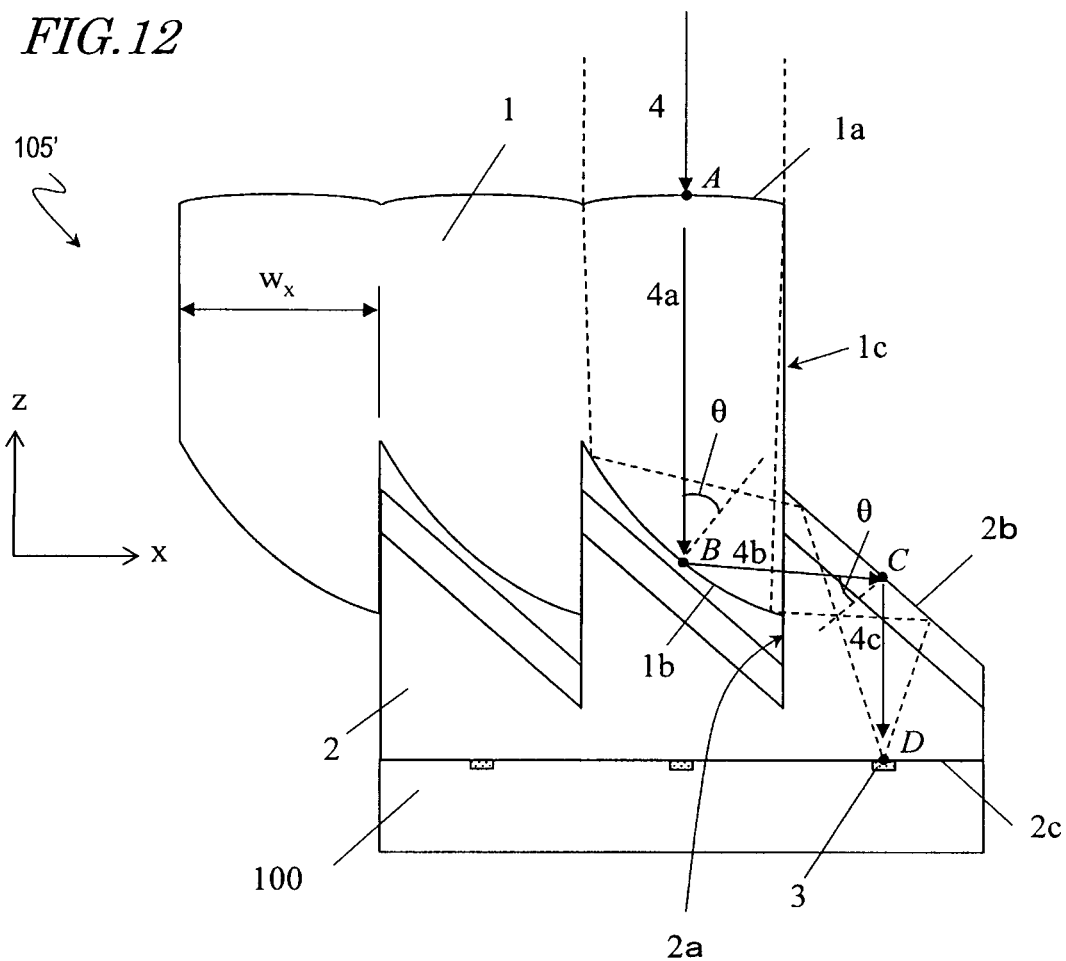
FIG. 12 A side view illustrating how three unit structures which are arranged in the x direction in the concentrating solar cell of the second embodiment look when viewed from the negative y-axis direction.
Figure 13:
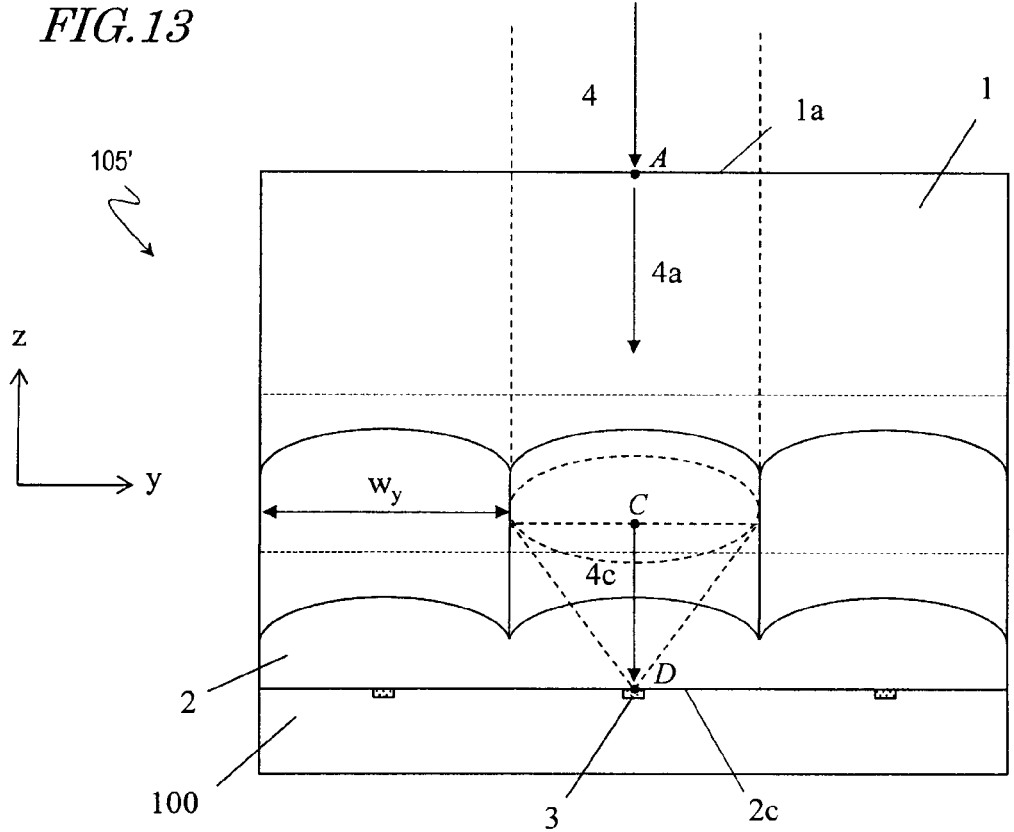
FIG. 13 A side view illustrating how three unit structures which are arranged in the y direction in the concentrating solar cell of the second embodiment look when viewed from the x-axis direction.

FIG. 9 is an exploded perspective view illustrating 3×2 unit structures of a concentrating lens array according to the first embodiment. FIG. 10 is an exploded side view illustrating how three unit structures which are arranged in the x direction look when viewed from the negative y-axis direction. FIG. 11 is an exploded side view illustrating how three unit structures which are arranged in the y direction look when viewed from the x-axis direction. FIG. 12 is a side view illustrating how three unit structures which are arranged in the x direction in the solar cell of this embodiment look when viewed from the negative y-axis direction. And FIG. 13 is a side view illustrating how three unit structures which are arranged in the y direction in the solar cell of this embodiment look when viewed from the x-axis direction. Hereinafter, the concentrating lens array and solar cell of this embodiment will be described in further detail with reference to these drawings.

As described above, each unit structure of the concentrating lens array 105' includes first and second concentrating members 1 and 2, which are made of the same material as their counterparts of the first embodiment.

As shown in FIGS. 9 and 10, the first concentrating member 1 has first and second surfaces 1a and 1b. The incoming sunlight irradiates the first surface 1a, through which the sunlight enters the inside of the first concentrating member 1. The second surface 1b has a curved shape which extends at least in the y-axis direction that is the first direction. The curved shape extending in the y-axis direction is defined by a curve, of which cross sections that intersect with the y axis at right angles at arbitrary positions on the y axis have the same shape. In the first concentrating member 1, the sunlight that has been incident on the first surface 1a and then transmitted through the inside of the first concentrating member 1 is reflected from the second surface 1b. This reflection is Fresnel reflection (including total reflection) to be caused due to a difference in refractive index between the material of the first concentrating member 1 and the environmental medium such as the air) that surrounds the first concentrating member 1 (or a reflective film or transparent film that has been formed on the surface of the first concentrating member).

The first and second surfaces 1a and 1b face each other. The first concentrating member 1 further has an emitting surface 1c, through which the sunlight that has been reflected from the second surface goes out of this member. The emitting surface 1c is located between the first and second surfaces 1a and 1b. The first surface 1a is suitably a circular cylinder with a cylinder axis that extends in a first direction (the y-axis direction), i.e., that is parallel to the first direction. The first concentrating member 1 has a width Wx in the x direction.

As shown in FIGS. 9, 10 and 11, the second concentrating member 2 has third and fourth surfaces 2b and 2c. The third surface 2b has a curve shape which extends in a second direction that is not parallel to the first direction (e.g., a direction in which a line extends in an xz plane) and reflects the sunlight that has been reflected from the second surface 1b of the first concentrating member 1 toward the inside of the second concentrating member 2. As in the first concentrating member 1, this reflection is also Fresnel reflection including total reflection. The fourth surface 2c lets the sunlight that has been transmitted through the inside of the second concentrating member 2 go out of the second member 2. The second concentrating member 2 further has an incident surface 2a on which the sunlight that has been reflected from the second surface 1b of the first concentrating member 1 is incident. The incident surface 2a is located between the third and fourth surfaces 2b and 2c. The second concentrating member 2 has a width Wy in the y direction.

As shown in FIG. 12, in the concentrating lens array 105', the first and second concentrating members 1 and 2 are arranged so that at least part of the emitting surface 1c of the first concentrating member 1 and at least part of the incident surface 2a of the second concentrating member 2 are in contact with each other. To transmit the sunlight efficiently through the junction between the emitting surface 1c of the first concentrating member 1 and the incident surface 2a of the second concentrating member 2, the emitting surface 1c and the incident surface 2a are suitably planes. However, if the first and second concentrating members 1 and 2 are made of the same material and have the same refractive index, the emitting surface 1c and the incident surface 2a may have any other shape as long as the emitting surface is and the incident surface 2a have corresponding shapes and can be closely bonded together with an adhesive with no gaps left between them. The fourth surface 2c may be a plane, a curved surface, or a circular cylinder, of which the cylinder axis is parallel to the second direction. Optionally, an antireflection film may be arranged between the photosensitive sections 3 and the fourth surface 2c to reduce reflection from their interface.

As described above, the first concentrating member of each unit structure is located on the second concentrating member 2 of another unit structure that is adjacent to the former unit structure in the x direction. A gap is suitably left between the second surface 1b of the first concentrating member 1 and the third surface 2b of the second concentrating member 2 of the unit structure that is located adjacent to the second surface 1b. The reason is that if the second and third surfaces 1b and 2b were in contact with each other, the sunlight would be transmitted from the first concentrating member 1 into the second concentrating member 2 of the adjacent unit structure through the contacting portion of the second surface 1b. In this embodiment, however, the second and third surfaces 1b and 2b have curved shapes in mutually different directions. That is why if the second and third surfaces 1b and 2b contact with each other, their contacting portion will be a point. For that reason, even if the second and third surfaces 1b and 2b contact with each other, almost no light will be transmitted from the first concentrating member 1 into the second concentrating member 2 of the adjacent unit structure, thus causing no serious problems.

In the concentrating lens array 105', the sunlight that has been incident on the first surface 1a of the first concentrating member 1 is reflected from the second surface 1b and then goes out of the first concentrating member 1 through the emitting surface 1c. In this embodiment, since the second surface 1b has a curved shape that extends in the first direction (along the y axis), the incident sunlight has a predetermined converged state on only a plane that intersects with the first direction at right angles (i.e., xz plane). Next, the sunlight that has gone out of the first concentrating member 1 enters the second concentrating member 2 through the incident surface 2a, is reflected from the third surface 2b, and then goes out of the second concentrating member 2 through the fourth surface 2c. In this embodiment, since the third surface 2b has a curved shape that extends in the second direction, the incident sunlight has a predetermined converged state on only a plane that intersects with the second direction at right angles (i.e., a plane including the y axis). That is why the sunlight that has gone out through the fourth surface 2c is converged within a plane that intersects with the first direction at right angles and within a plane that intersects with the second direction at right angles. Since the first and second directions are not parallel to each other, the sunlight can be converged within two planes that are not parallel to each other. If the first and second directions are perpendicular to each other, then those two planes will intersect with each other at right angles. Consequently, the sunlight can be converged and an image of the sun can be produced within a plane that intersects at right angles with the line where those two planes meet each other.

As shown in FIG. 12, a soar cell substrate 100 including a plurality of photosensitive sections 3 is bonded to the fourth surface 2c of the second concentrating member 2. The sunlight that has been concentrated as described above by the respective unit structures of the concentrating lens array 105' then irradiates the photosensitive sections 3 which are arranged to face the respective unit structures of the concentrating lens array 105'. As a result, the sunlight can be collected with high light concentration efficiency and can be converted into electrical energy by the photosensitive sections 3 of the solar cell.

The sunlight can be converged in this manner by Fresnel reflection including the total reflection from the second surface 1b of the first concentrating member 1 and the third surface 2b of the second concentrating member 2b. That is why the sunlight can be collected with chromatic aberration reduced without depending on the wavelength. That is to say, the spot of the sunlight that irradiates the photosensitive sections 3 can have its size reduced. As a result, the light can be incident efficiently within the photosensitive sections 3.

Next, a structure that will concentrate the incoming light even more efficiently will be described with reference to FIGS. 9 through 13.

In the concentrating lens array 105' shown in FIGS. 9 to 13, the first and second surfaces 1a and 1b of the first concentrating member 1 are a circular cylinder and a hyperbolic cylinder, respectively, and the third and fourth surfaces 2b and 2c of the second concentrating member 2 are a parabolic cylinder and a plane, respectively. The cylinder axis of the circular cylinder that is the first surface 1a and the cylinder axes (focal lines) of the hyperbolic cylinder that is the second surface 1b are parallel to the first direction (i.e., the y axis). On the other hand, the cylinder axis (focal line) of the parabolic cylinder that is the third surface 2b is parallel to the second direction. In this embodiment, the second direction is parallel to a line on the xz plane.

As shown in FIG. 12, the cylinder of the first surface 1a has so large a radius of curvature that the first surface 1a is almost a plane. That is why a substantially parallel solar ray 4 is incident perpendicularly onto the first surface 1a, gets refracted a little and becomes a slightly concentrated light ray 4a. This light ray 4a is reflected from the second surface 1b to turn into a light ray 4b, which is then reflected from the third surface 2b to turn into a light ray 4c that travels along the z axis. And the light ray 4c goes out through the fourth surface 2c. The outgoing sunlight is eventually concentrated at a point D on the photosensitive section 3 of the solar cell substrate 100.

Suppose the intersections between the optical axis of the sunlight and the first, second and third surfaces 1a, 1b and 2b are indicated by A, B and C, respectively. Also, the refractive index of the material that makes the first and second concentrating members 1 and 2 is supposed to be n. As in the first embodiment, if the tilt angle θ defined by the optical axis of the light ray 4a with respect to a surface normal to the point B on the second surface 1b (where AB=z axis) is sufficiently larger than arcsin (1/n), the sunlight will be totally reflected from the entire area of the second surface 1b. For example, if the first and second concentrating members 1 and 2 are made of PMMA, the critical angle θc at and over which the total reflection is produced is approximately 42 degrees, because PMMA has a refractive index of approximately 1.5. For that reason, the tilt angle θ is at least equal to 45 degrees, and suitably equal to or greater than approximately 50 degrees.

If the tilt angle defined by the optical axis (BC) of the light ray 4b with respect to a surface normal to the point C on the third surface 2b is set to be equal to θ, the light ray 4b will also be totally reflected from the third surface 2b. The optical axis of the reflected light ray 4c agrees with that of the light ray 4a and is parallel to the z axis. Also, in this case, the optical axis of the reflected light ray 4b, i.e., its propagation direction, forms an angle 2θ (which is equal to or greater than approximately 100 degrees) with respect to the optical axis of the light ray 4a. Thus, the light ray 4b propagates through the negative side of the z axis. Consequently, the point C is located on the negative side of the z axis with respect to the point B. The tangent drawn at the point B at which the second surface 1b intersects with the xz plane curve is parallel to a line on which the third surface 2b intersects with the xz plane. That is why if the point C is located on the negative side of the z axis with respect to the point B, the third surface 2b will be located on the negative side of the z axis with respect to the second surface 1b that is located adjacent to the third surface 2b in the x direction when compared to each other at the same position x. Also, although the second surface 1b extends in the y-axis direction, the third surface 2b projects in the positive z-axis direction on a yz cross section, and the point C is located at the top of the third surface 2b. For that reason, the third surface 2b wilt be located on the negative side of the z axis with respect to the second surface 1b which is adjacent to the third surface 2b in the x direction even when compared at the same position y.

As described above, in each unit structure, the first concentrating member 1 is not located over the second concentrating member 2 of its own, but is located over the second concentrating member 2 of an adjacent unit structure. That is why the foregoing statement of the relative positions of the second and third surfaces 1b and 2b in each unit structure also applies to the relative positions of the second surface 1b in each unit structure and the third surface 2b of the adjacent unit structure. That is to say, the second surface 1b of the first concentrating member 1 in each unit structure is located on the positive side of the z axis with respect to the third surface 2b of the second concentrating member 2 of the adjacent unit structure. And the first concentrating member 1 of each unit structure can be arranged over the second concentrating member 2 of the adjacent unit structure without causing interference between them. By arranging such unit structures repeatedly in the concentrating lens array 105', the textured structure defined by the respective second surfaces 1b of the first concentrating members 1 is engageable with the textured structure defined by the respective third surfaces 2b of the second concentrating members 2. As a result, the concentrating lens array 105' can have a reduced thickness.

Next, respective curved shapes of the first, second and third surfaces 1a, 1b and 2b will be described. Generally speaking, a hyperbola has two focuses $F_1$ and $F_2$. A light ray concentrated at the focus $F_2$ is reflected from the hyperbola and concentrated at the other focus $F_1$ with no aberrations. On the other hand, a parabola has a single focus $F_3$, and a parallel light ray traveling along the center axis is reflected from the parabola and concentrated at the focus $F_3$ with no aberrations.

On a plane which intersects with the first direction at right angles, i.e., on an xz plane, the sunlight is concentrated through the first and second surfaces 1a and 1b. If, of the two focal lines $F_1$ and $F_2$ of a hyperbolic cylinder that defines the second surface 1b, the focal line $F_1$ is proximate to the hyperbolic cylinder, then a focal line of the circular cylinder that defines the first surface 1a needs to agree with the focal line $F_2$ of the hyperbolic cylinder. Meanwhile, if the light ray 4b were not reflected from the third surface 2b but went straight on through the third surface 2b, the optical axis BC would be extended to make the focal line $F_1$ agree with a position which is located at a distance CD from the point C. On the other hand, the third surface 2b is a parabolic cylinder with a cylinder axis in the xz plane, and therefore, has no concentrating function in the xz plane. Consequently, the sunlight 4 that is a parallel light ray will be concentrated at the point D on a plane that intersects with the first direction at right angles (i.e., on the xz plane) by passing through the first and second surfaces 1a and 1b. Since the distance from the first surface 1a to the focal line $F_2$ is sufficiently longer than the thickness of the concentrating lens array 105' as measured in the z direction as will be described later, the circular cylinder that defines the first surface 1a can have a larger radius of curvature than a conventional one, and the first surface 1a can be substantially flat.

On the other hand, on a plane which intersects with the second direction at right angles (i.e., a plane including the y axis), the sunlight 4 is not concentrated by the first concentrating member 1 but is incident as a parallel light ray 4b on the third surface 2b of the second concentrating member 2. That is why on the plane that intersects with the second direction at right angles, the sunlight is converged through the third surface 2b. Specifically, the focal line $F_3$ of the parabolic cylinder that defines the third surface 2 is matched with the point D. Strictly speaking, in a plane that passes through CD and that intersects with the xz plane at right angles, the focus of the parabola defining the intersecting line between that plane and the third surface 2 is matched with the point D. As a result, in a plane which intersects with the second direction at right angles (i.e., a plane including the y axis), the light ray 4b is concentrated at the point D through the third surface 2b.

If the respective focal lines of the circular, hyperbolic and parabolic cylinders satisfy the relation described above, the sunlight 4 will be concentrated at the point D to form the smallest spot there and then incident on the photosensitive section 3. However, the spot size of the sunlight incident on the photosensitive section 3 is adjustable according to the area of the photosensitive section 3. For example, if the length of the photosensitive section 3 is approximately 5 mm each side, the spot size of the sunlight incident on the photosensitive section 3 may also have a diameter of 5 mm or less. In that case, even if the respective focal lines of the circular, hyperbolic and parabolic cylinders and the point D fail to exactly satisfy the relation described above but if the sunlight can be converged on the photosensitive section 3 as a light ray with a diameter of 5 mm or less, sufficiently high conversion efficiency can be maintained.

It should be noted that the sunlight is not perfectly parallel light but its propagating direction will vary by approximately ±0.26 degrees. Also, a sun-tracking concentrating solar cell system will cause a sun-tracking control error of approximately ±0.2 degrees. That is why even if the solar cell is aligned with the direction of the sun so that the sunlight is incident perpendicularly onto the first surface 1a, the sunlight that has entered the first concentrating member 1 through the first surface 1a may still go out of the first concentrating member 1 directly through the emitting surface 1c to be stray light. Thus, in order to minimize such stray light on the xz plane, the first surface 1a is implemented in this embodiment as a circular cylinder with a large radius of curvature. If the NA is as large as 0.02, every solar ray with an angular deviation can be turned into a converging light ray. Furthermore, in order to minimize the stray light on the yz plane, too, the first surface 1a is suitably implemented as a sphere as described above. On the other hand, if such stray light is not a problem, the first surface 1a may be a plane. In that case, since the first surface 1a becomes a perfect plane, deposition of dust can be eliminated almost completely.

As can be seen from the foregoing description, the concentrating lens array 105' of this embodiment concentrates the incoming sunlight on a plane that intersects at right angles with the first direction (i.e., xz plane) and on plane that intersects at right angles with the second direction (i.e., a plane including the y axis) independently of each other, and therefore, the hyperbolic cylinder defining the second surface 1b and the parabolic cylinder defining the third surface 2b can be designed independently of each other. As a result, the concentrating lens array 105' can be designed easily. In addition, the first and second concentrating members 1 and 2 are each made up of a combination of planes and cylinders, and can be formed easily by machining. Also, even if the first and second concentrating members 1 and 2 are formed on a unit structure basis, the concentrating lens array 105' can also be obtained just by fitting those unit structures to each other and bonding their flat portions together with an adhesive. As a result, such an array lenses can be formed very easily.

On top of that, since the first surface 1a has a sufficiently large radius of curvature, the surface of the concentrating lens array 105' can be said to be almost flat, and therefore, deposition of dirt or dust on the depressions of the surface can be reduced significantly. Moreover, since the light is reflected from the first surface 1a substantially along the axis of incidence, the light is reflected too little to be scattered around and cause harmful effects on the surrounding environment.

Furthermore, the incoming light is concentrated by being reflected from the second and third surfaces 1b and 2b. Since the first surface 1a has almost no refracting power, the chromatic aberration involved with concentrating the light can be reduced to almost zero. That is why the size of the condensed spot can be reduced at the point of convergence, and the area of the photosensitive section 3 to capture the light can be reduced, too. Moreover, reflection from these surfaces is total reflection that involves no loss, and the light can be transmitted highly efficiently. For these reasons, a solar cell including an inexpensive and stabilized concentrating lens array with high light concentration efficiency (which is the ratio of the lens area to the overall photosensitive section area) can be provided.

To allow the concentrating lens array 105' of this embodiment to concentrate light even more efficiently, the shapes of the first and second surfaces 1a and 1b of the first concentrating member 1 and the third and fourth surfaces 2b and 2c of the second concentrating member 2 are suitably any of the combinations shown in the following Table 2. For example, even though the first surface 1a is a circular cylinder in the embodiment described above, the first surface 1a may also be a sphere or a plane. Also, the fourth surface 2c is supposed to be a plane in the embodiment described above, but may also be a circular cylinder or a sphere as well.

TABLE 2

| First surface 1a | Second surface 1b | Third surface 2b | Fourth surface 2c |
|---|---|---|---|
| Circular cylinder | Hyperbolic cylinder | Parabolic cylinder | Plane |
| Circular cylinder | Hyperbolic cylinder | Hyperbolic cylinder | Circular cylinder |
| Plane | Parabolic cylinder | Parabolic cylinder | Plane |
| Plane | Parabolic cylinder | Hyperbolic cylinder | Circular cylinder |
| Sphere | Hyperbolic cylinder | Hyperbolic cylinder | Plane |
| Plane | Hyperbolic cylinder | Hyperbolic cylinder | Sphere |
| Sphere | Hyperbolic cylinder | Hyperbolic cylinder | Sphere | if the first surface 1a is a circular cylinder, the focal line of the circular cylinder is parallel to the first direction. The focal line(s) of the hyperbolic or parabolic cylinder defining the second surface 1a is/are also parallel to the first direction. On the other hand, the focal line(s) of the hyperbolic or parabolic cylinder defining the third surface 2ba is/are parallel to the second direction. Meanwhile, if the fourth surface 2c is a circular cylinder, the focal line of the circular cylinder is parallel to the second direction.

Also, if the first surface 1a is a circular cylinder, the focal line of the circular cylinder suitably agrees with one of the two focal lines of the hyperbolic cylinder defining the second surface 1b. In that case, the other of the two focal lines suitably agrees with the location of the photosensitive section on the solar cell substrate with reflection from the third surface 2b and refraction by the fourth surface 2c taken into account.

If the first surface 1a is a plane, the focal line of the parabolic cylinder defining the second surface 1b suitably agrees with the location of the photosensitive section on the solar cell substrate with reflection from the third surface 2b and refraction by the fourth surface 2c taken into account.

If the first surface 1a is a sphere, the focus of the sphere suitably agrees with one of the two focal lines of the hyperbolic cylinder defining the second surface 1b. In that case, the other of the two focal lines suitably agrees with the location of the photosensitive section on the solar cell substrate with reflection from the third surface 2b and refraction by the fourth surface 2c taken into account.

Also, if the fourth surface 2c is a circular cylinder, the focal line of the circular cylinder suitably agrees with one of the two focal lines of the hyperbolic cylinder defining the third surface 2b. In that case, the other of the two focal lines suitably agrees with the location of the photosensitive section on the solar cell substrate with refraction by the fourth surface 2c taken into account.

If the fourth surface 2c is a plane, the focal line of the parabolic cylinder defining the third surface 2b suitably agrees with the location of the photosensitive section on the solar cell substrate with refraction by the fourth surface 2c taken into account.

If the first surface 1a is a sphere, the focus of the sphere suitably agrees with one of the two focal lines of the hyperbolic cylinder defining the third surface 2b. In that case, the other of the two focal lines suitably agrees with the location of the photosensitive section on the solar cell substrate with reflection from the third surface 2b and refraction by the fourth surface 2c taken into account.

Furthermore, if the first and fourth surfaces 1a and 2c are either a plane and a sphere or a sphere and a plane, respectively, the focus of the sphere suitably agrees with one of the two focal lines of the hyperbolic cylinder defining the second surface 1b and one of the two focal lines of the hyperbolic cylinder defining the third surface 2b.

In the embodiment described above, reflection from the second and third surfaces 1b and 2b is suitably Fresnel reflection including total reflection. Optionally, however, metal film may be provided for at least one of the second and third surfaces 1b and 2b and the sunlight may be partially reflected from the metal film.

According to this embodiment, incoming light can be concentrated almost without causing chromatic aberrations, and therefore, the structure of this embodiment can be used effectively as a light concentrating mechanism for various optical systems other than the concentrating lens array. For example, a single unit structure of the concentrating lens array of the embodiment described above may be used as a concentrating optical system for an image capture device. In that case, since the focal lengths on xz and yz planes are different from each other, the image formed by a single unit structure of the concentrating lens array in generally distorted. That is why an intended image can be obtained by getting the image thus formed converted into an electrical signal by an image capture device and then removing the distortion through signal processing. Also, the sine condition that an image capturing lens should meet can be satisfied in the design process by combining the first and second surfaces 1a and 1b in the first direction and combining the third and fourth surfaces 2b and 2c in the second direction.

INDUSTRIAL APPLICABILITY

A concentrating lens array and solar cell according to the present disclosure concentrates incoming light using total reflection, and therefore, will cause little optical loss with no chromatic aberrations at all. That is why the light concentration efficiency of a lens array (i.e., the ratio of the lens area to the photosensitive section area) which has concentrated incoming light through a refractive lens can be increased significantly, thus contributing immensely to providing an inexpensive and stabilized concentrating lens array and a solar cell including such an array.

REFERENCE SIGNS LIST first concentrating member
1a first surface
1b second surface
2 second concentrating member
2b third surface
2c fourth surface
3 photosensitive section
4 sunlight
4a, 4b, 4c light ray
100 solar cell substrate
105, 105' concentrating lens array
200, 200' solar cell system

The invention claimed is:

1. A concentrating lens array which includes a plurality of unit structures that are arranged either in line or a two-dimensional array on a configuration plane,
   wherein each said unit structure comprises: a first surface through which light enters inside of the unit structure; a second surface which reflects, back to the inside, the light that has entered the structure through the first surface and that has been transmitted through the inside; a third surface which reflects, back to the inside, the light that has been reflected from the second surface; and a fourth surface which lets the light that has been reflected from the third surface go out of the structure,
   in each said unit structure, the second and third surfaces are located between an incident plane including the first surface and an emitting plane including the fourth surface,
   at least one of the second and third surfaces reflects the light after having converged the incoming light,
   when viewed perpendicularly to, and from over, the incident plane, the second surface of each said unit structure is laid upon the third surface of an adjacent unit structure, and is located closer to the incident plane than the third surface of the adjacent unit structure is, and
   each said unit structure concentrates the light within two planes which intersect with the configuration plane at right angles and which are not parallel to each other by using the second surface and/or the third surface.

2. The concentrating lens array of claim 1, wherein each said unit structure includes:
   a first concentrating member which has the first and second surfaces that are arranged perpendicularly to the incident plane and an emitting plane that lets the light that has been reflected from the second surface go out of the first concentrating member; and
   a second concentrating member which has the third and fourth surfaces that are arranged perpendicularly to the incident plane and an incident plane on which the light that has gone out of the first concentrating member through its emitting plane is incident, and
   at least a part of the emitting plane of the first concentrating member and at least a part of the incident plane of the second concentrating member are in contact with each other.

3. The concentrating lens array of claim 2, wherein reflection from the second surface of the first concentrating member and reflection from the third surface of the second concentrating member include total reflection.

4. The concentrating lens array of claim 2, wherein the first concentrating member of each said unit structure is located on the second concentrating member of an adjacent unit structure.

5. The concentrating lens array of claim 1, wherein at least one of the second and third surfaces forms part of a rotary surface.

6. The concentrating lens array of claim 5, wherein the other of the second and third surfaces is a plane.

7. The concentrating lens array of claim 6, wherein one of the second and third surfaces is a paraboloid and the other is a plane.

8. The concentrating lens array of claim 5, wherein the second surface is a paraboloid and the third surface is a hyperboloid.

9. The concentrating lens array of claim 5, wherein one of the first and fourth surfaces is a sphere, and
one of the second and third surfaces is a hyperboloid and the other is a plane.

10. The concentrating lens array of claim 5, wherein one of the first and fourth surfaces is a sphere, and
the second and third surfaces are hyperboloids.

11. The concentrating lens array of claim 1, wherein the second surface has a cylindrical shape with a cylinder axis which extends in a first direction, and
the third surface has another cylindrical shape with a cylinder axis which extends in a second direction that is not parallel to the first direction.

12. The concentrating lens array of claim 11, wherein the first and second directions intersect with each other at right angles.

13. The concentrating lens array of claim 12, wherein the first surface is a circular cylinder, of which the cylinder axis is parallel to the first direction,
the second surface is a hyperbolic cylinder, of which the cylinder axis is parallel to the first direction, and
the third surface is a parabolic cylinder, of which the cylinder axis is parallel to the second direction.

14. The concentrating lens array of claim 12, wherein the first surface is a plane which is parallel to the first direction,
the second surface is a parabolic cylinder, of which the cylinder axis is parallel to the first direction, and
the third surface is a parabolic cylinder, of which the cylinder axis is parallel to the second direction.

15. The concentrating lens array of claim 12, wherein the first surface is a sphere,
the second surface is a hyperbolic cylinder, of which the cylinder axis is parallel to the first direction, and
the third surface is a hyperbolic cylinder, of which the cylinder axis is parallel to the second direction.

16. A solar cell comprising:
the concentrating lens array of claim 1; and
a solar cell substrate which includes a plurality of photosensitive sections that are arranged in a pattern corresponding to the pattern of the respective unit structures that the concentrating lens array has,
wherein each said unit structure concentrates light onto associated ones of the photosensitive sections.

17. A solar cell system comprising:
the solar cell of claim 16;
a rotating mechanism section including a rotating motor to rotate the solar cell;
a control section which generates a tracking error of the solar cell substrate with respect to the sun based on a signal supplied from the solar cell and which sends a rotation signal to the rotating mechanism section; and
a power storing and transmitting section which either stores or transmits the electrical energy that has been generated by the solar cell substrate through conversion.

* * * * *